United States Patent
Yu et al.

(10) Patent No.: US 12,453,148 B2
(45) Date of Patent: Oct. 21, 2025

(54) INTEGRATED CIRCUIT DEVICE INCLUDING FIELD-EFFECT TRANSISTOR WITH CONTROLLED SIZES AND CONFIGURATIONS

(71) Applicant: Samsung Electronics Co., Ltd., Suwon-si (KR)

(72) Inventors: Sumin Yu, Suwon-si (KR); Jungtaek Kim, Suwon-si (KR); Moonseung Yang, Suwon-si (KR); Seojin Jeong, Suwon-si (KR); Edward Namkyu Cho, Suwon-si (KR); Seokhoon Kim, Suwon-si (KR); Pankwi Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 420 days.

(21) Appl. No.: 18/149,957

(22) Filed: Jan. 4, 2023

(65) Prior Publication Data
US 2023/0395661 A1    Dec. 7, 2023

(30) Foreign Application Priority Data

Jun. 3, 2022    (KR) .................. 10-2022-0068509

(51) Int. Cl.
| | |
|---|---|
| *H10D 30/43* | (2025.01) |
| *H10D 30/01* | (2025.01) |
| *H10D 30/62* | (2025.01) |
| *H10D 30/67* | (2025.01) |

(Continued)

(52) U.S. Cl.
CPC ......... *H10D 62/151* (2025.01); *H10D 30/014* (2025.01); *H10D 30/43* (2025.01); *H10D 30/62* (2025.01); *H10D 30/6735* (2025.01); *H10D 62/121* (2025.01)

(58) Field of Classification Search
None
See application file for complete search history.

(56) References Cited

U.S. PATENT DOCUMENTS

| | | |
|---|---|---|
| 8,426,916 B2 | 4/2013 | Kim et al. |
| 9,570,609 B2 | 2/2017 | Obradovic et al. |
| 10,804,165 B2 | 10/2020 | Seo et al. |

(Continued)

OTHER PUBLICATIONS

Office Action in Korean Appln. No. 10-2022-0068509, mailed on Sep. 9, 2025, 16 pages (with English translation).

*Primary Examiner* — Daniel Whalen
(74) *Attorney, Agent, or Firm* — Fish & Richardson P.C.

(57) ABSTRACT

An integrated circuit (IC) device including fin-type active regions parallel to each other on a substrate, the fin-type active regions extending in a first lateral direction, a first nanosheet stack apart from a fin top surface of a first fin-type active region selected from the fin-type active regions, the first nanosheet stack including at least one nanosheet facing the fin top surface of the first fin-type active region, a gate structure surrounding the first nanosheet stack, the gate structure extending in a second lateral direction, a first source/drain region in contact with one sidewall of the first nanosheet stack, and a second source/drain region in contact with another sidewall of the first nanosheet stack, wherein a greatest width of the first source/drain region is less than a greatest width of the second source/drain region in the second lateral direction may be provided.

20 Claims, 32 Drawing Sheets

(51) Int. Cl.
  *H10D 62/10*  (2025.01)
  *H10D 62/13*  (2025.01)

(56) References Cited

U.S. PATENT DOCUMENTS

| | | |
|---|---|---|
| 11,031,502 B2 | 6/2021 | Jang et al. |
| 11,145,720 B2 | 10/2021 | Lee et al. |
| 2018/0182756 A1 | 6/2018 | Lee et al. |
| 2020/0105754 A1 | 4/2020 | Murthy et al. |
| 2020/0365586 A1* | 11/2020 | Shin ................ H10D 30/62 |
| 2020/0395446 A1* | 12/2020 | Yi .................... B82Y 10/00 |
| 2022/0051947 A1 | 2/2022 | More |
| 2022/0069134 A1 | 3/2022 | Kim et al. |

\* cited by examiner

INTEGRATED CIRCUIT DEVICE INCLUDING FIELD-EFFECT TRANSISTOR WITH CONTROLLED SIZES AND CONFIGURATIONS

CROSS-REFERENCE TO RELATED APPLICATION

This application is based on and claims priority under 35 U.S.C. § 119 to Korean Patent Application No. 10-2022-0068509, filed on Jun. 3, 2022, in the Korean Intellectual Property Office, the disclosure of which is incorporated by reference herein in its entirety.

BACKGROUND

The inventive concepts relate to integrated circuit (IC) devices, and more particularly, to IC devices including a field-effect transistor (FET).

Due to the development of electronics technology, the downscaling of IC devices has rapidly progressed in recent years. Because semiconductor devices require not only a high operating speed but also operation accuracy, a vast amount of research has been conducted into optimizing structures of transistors in the semiconductor devices.

SUMMARY

The inventive concepts provide integrated circuit (IC) devices having a structure capable of ensuring different electrical properties that are desired according to arrangement structures and types of devices formed on the same substrate even when the area of a device region is reduced with the downscaling of IC devices.

According to an aspect of the inventive concepts, an IC device may include a plurality of fin-type active regions parallel to each other on a substrate, the plurality of fin-type active regions extending in a first lateral direction, a first nanosheet stack apart from a fin top surface of a first fin-type active region in a vertical direction, the first fin-type active region being selected from the plurality of fin-type active regions, the first nanosheet stack including at least one nanosheet facing the fin top surface of the first fin-type active region, a gate structure surrounding the first nanosheet stack on the first fin-type active region, the gate structure extending in a second lateral direction, wherein the second lateral direction is perpendicular to the first lateral direction, a first source/drain region in contact with one sidewall of the first nanosheet stack at a position adjacent to one side of the gate structure, and a second source/drain region in contact with another sidewall of the first nanosheet stack at a position adjacent to another side of the gate structure, wherein a greatest width of the first source/drain region is less than a greatest width of the second source/drain region in the second lateral direction.

According to another aspect of the inventive concepts, an IC device may include a first fin-type active region and a second fin-type active region being on a straight line, the first fin-type active region and the second fin-type active region each extending in a first lateral direction on a substrate, the first fin-type active region and the second fin-type active region apart from each other in the first lateral direction with a separation region therebetween, a third fin-type active region apart from the first fin-type active region, the second fin-type active region, and the separation region in a second lateral direction, the third fin-type active region extending in the first lateral direction, the second lateral direction being perpendicular to the first lateral direction, a plurality of nanosheet stacks on each of the first fin-type active region, the second fin-type active region, and the third fin-type active region, the plurality of nanosheet stacks each including at least one nanosheet, a first source/drain region on the third fin-type active region, the first source/drain region being in contact with one sidewall of a first nanosheet stack on the third fin-type active region, from among the plurality of nanosheet stacks, the first source/drain region facing the first fin-type active region in the second lateral direction, and a second source/drain region on the third fin-type active region, the second source/drain region being in contact with another sidewall of the first nanosheet stack, the second source/drain region facing the separation region in the second lateral direction, wherein a greatest width of the first source/drain region is less than a greatest width of the second source/drain region in the second lateral direction.

According to another aspect of the inventive concepts, an IC device may include a plurality of fin-type active regions extending in a first lateral direction on a substrate, a plurality of source/drain regions on the plurality of fin-type active regions, at least one nanosheet on a fin top surface of a first fin-type active region that is selected from the plurality of fin-type active regions, a gate structure surrounding the at least one nanosheet on the first fin-type active region, the gate structure extending in a second lateral direction, the second lateral direction being perpendicular to the first lateral direction, a first source/drain region selected from the plurality of source/drain regions, the first source/drain region being on the first fin-type active region and having a first side surface in contact with one sidewall of the at least one nanosheet, a second source/drain region selected from the plurality of source/drain regions, the second source/drain region being on the first fin-type active region and having a second side surface in contact with another sidewall of the at least one nanosheet, a third source/drain region selected from the plurality of source/drain regions, the third source/drain region being closest to the first source/drain region in the second lateral direction, the third source/drain region being a first distance apart from the first fin-type active region, a fourth source/drain region selected from the plurality of source/drain regions, the fourth source/drain region being closest to the second source/drain region in the second lateral direction, the fourth source/drain region being a second distance apart from the first fin-type active region, the second distance being greater than the first distance, wherein a greatest width of the first source/drain region is less than a greatest width of the second source/drain region in the second lateral direction, and a first vertical level of a first lowermost surface of the first source/drain region, which is in contact with the first fin-type active region, is lower than a second vertical level of a second lowermost surface of the second source/drain region, which is in contact with the first fin-type active region.

BRIEF DESCRIPTION OF THE DRAWINGS

Some example embodiments of the inventive concepts will be more clearly understood from the following detailed description taken in conjunction with the accompanying drawings in which:

FIGS. 15A to 23 are cross-sectional views of a process sequence of a method of manufacturing an IC device, according to an example embodiment, wherein FIGS. 15A, 16A, 17A, 18A, 19A, and 20 to 23 are cross-sectional views of a portion corresponding to a cross-section taken along line X1-X1' of FIG. 1, according to a process sequence.

DETAILED DESCRIPTION

Figure 1:
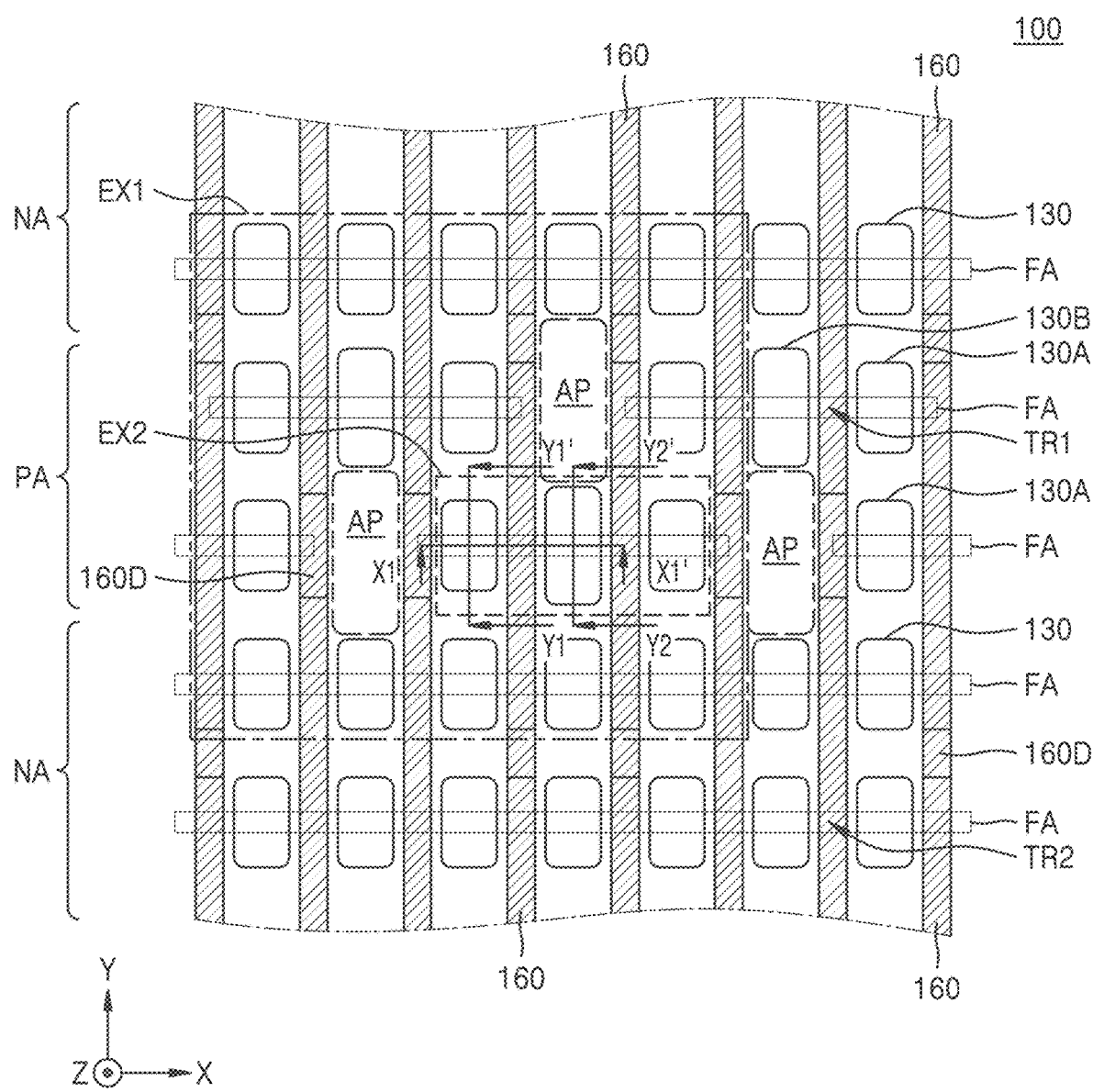
FIG. 1 is a plan layout diagram of some components of an integrated circuit (IC) device according to an example embodiment.

Hereinafter, some example embodiments will be described in detail with reference to the accompanying drawings. The same reference numerals are used to denote the same elements in the drawings, and repeated descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2A:
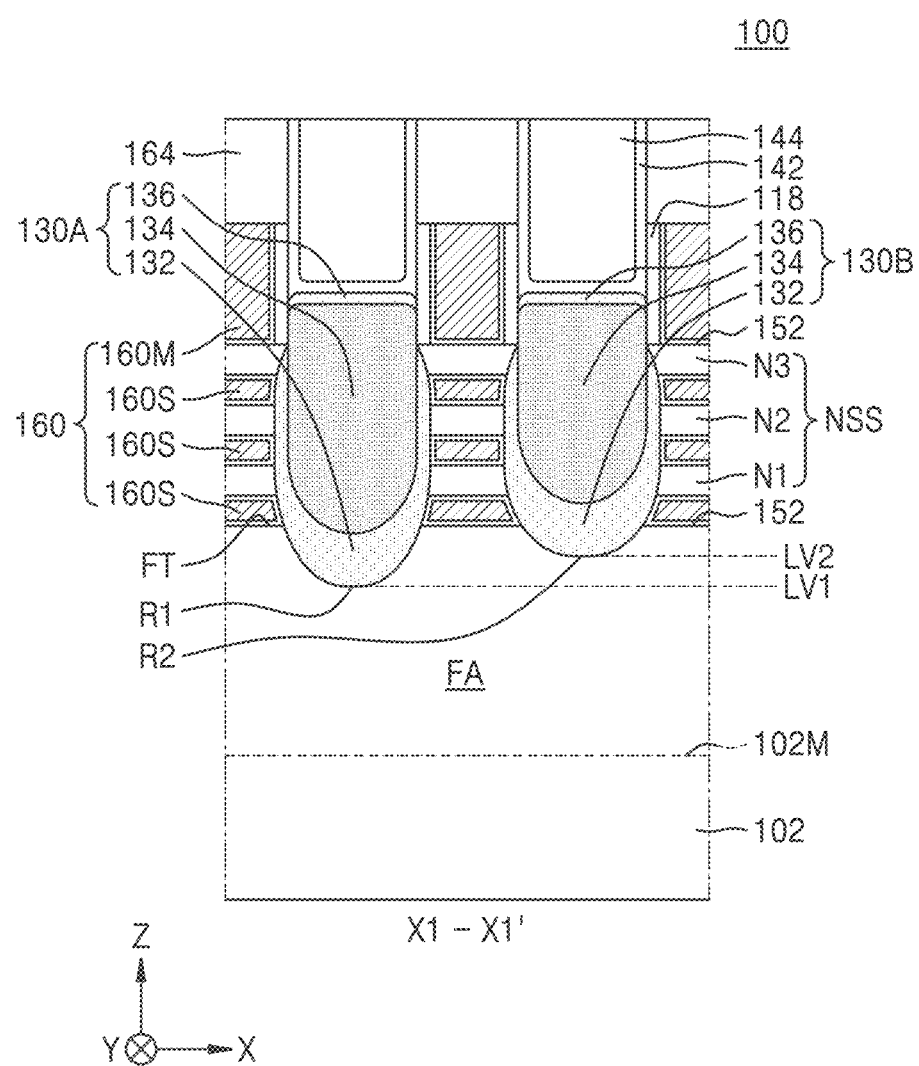
FIG. 2A is a cross-sectional view taken along line X1-X1' of FIG. 1.
Figure 2B:
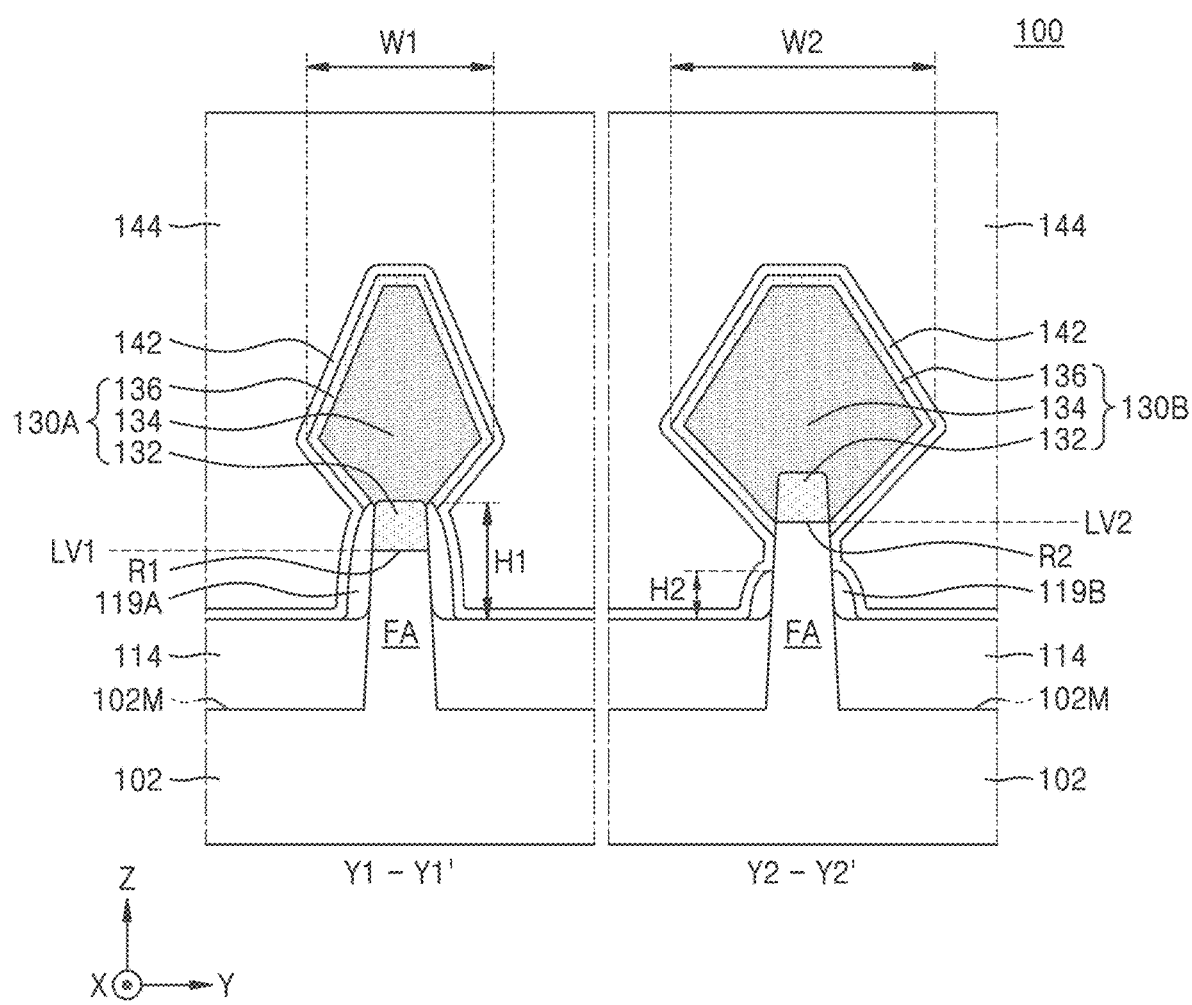
FIG. 2B shows cross-sectional views of components, which are taken along lines Y1-Y1' and Y2-Y2' of FIG. 1.
Figure 2C:
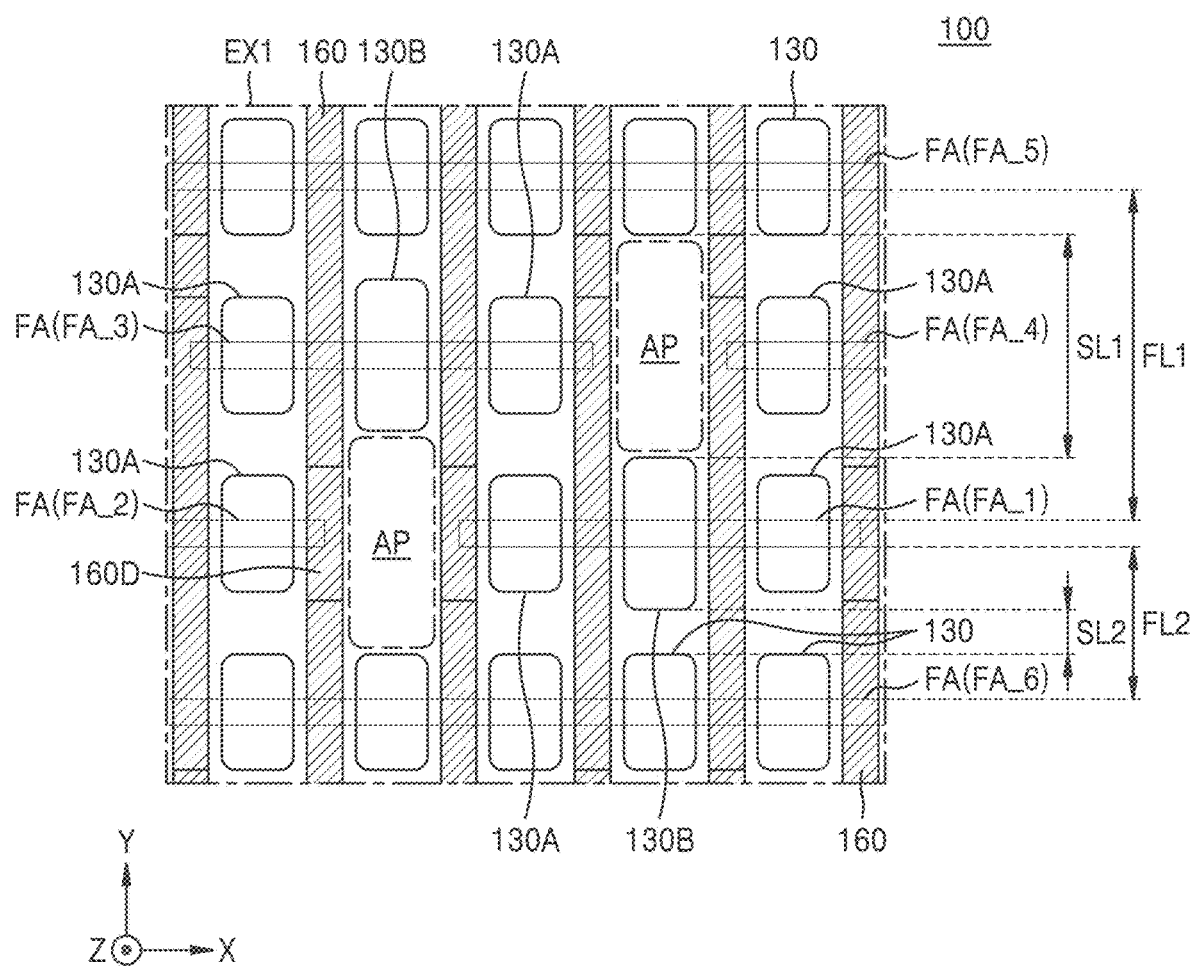
FIG. 2C is an enlarged plan layout diagram of a local region "EX1" of FIG. 1.

FIG. 1 is a plan layout diagram of some components of an integrated circuit (IC) device 100 according to an example embodiment. FIG. 2A is a cross-sectional view taken along line X1-X1' of FIG. 1. FIG. 2B shows cross-sectional views of configurations, which are taken along lines Y1-Y1' and Y2-Y2' of FIG. 1. FIG. 2C is an enlarged plan layout diagram of a local region "EX1" of FIG. 1. The IC device 100 including a field-effect transistor (FET) TR having a gate-all-around structure, which includes an active region of a nanowire or nanosheet type and a gate surrounding the active region, will now be described with reference to FIGS. 1 and 2A to 2C.

Referring to FIGS. 1 and 2A to 2C, the IC device 100 may include a plurality of fin-type active regions FA, which protrude upward from a substrate 102 in a vertical direction (Z direction) and extend long in a first lateral direction (X direction) in a plurality of N-channel metal-oxide semiconductor (NMOS) transistor regions NA and a plurality of P-channel metal-oxide semiconductor (PMOS) transistor regions PA. A plurality of nanosheet stacks NSS may be on the plurality of fin-type active regions FA. Each of the plurality of nanosheet stacks NSS may include at least one nanosheet, which is apart from a fin top surface FT of the fin-type active region FA in the vertical direction (Z direction) and faces the fin top surface FT of the fin-type active region FA. As used herein, the term "nanosheet" refers to a conductive structure having cross-section that is substantially perpendicular to a direction in which current flows. The nanosheet should be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A device isolation film (see 114 in FIG. 2B) may be on the substrate 102 to cover both sidewalls of each of the plurality of fin-type active regions FA. The device isolation film 114 may include an oxide film, a nitride film, or a combination thereof.

A plurality of gate structures 160 may be on the plurality of fin-type active regions FA. Each of the plurality of gate structures 160 may extend in a second lateral direction (Y direction), which is perpendicular to the first lateral direction (X direction). The plurality of nanosheet stacks NSS may be on fin top surfaces FT of the plurality of fin-type active regions FA, respectively, in portions where the plurality of fin-type active regions FA intersect with the plurality of gate structures 160.

Each of the plurality of nanosheet stacks NSS may include a plurality of nanosheets (e.g., a first nanosheet N1, a second nanosheet N2, and a third nanosheet N3), which overlap each other in the vertical direction (Z direction) on the fin-type active region FA. The first nanosheet N1, the second nanosheet N2, and the third nanosheet N3 may be at different vertical distances (Z-directional distances) from a top surface of the fin-type active region FA, respectively.

Each of the first to third nanosheets N1, N2, and N3 included in the nanosheet stack NSS may have a channel region. For example, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In some example embodiments, the first to third nanosheets N1, N2, and N3 may have substantially the same thickness in the vertical direction (Z direction). In other example embodiments, at least some of the first to third nanosheets N1, N2, and N3 may have different thicknesses in the vertical direction (Z direction).

In some example embodiments, at least some of the first to third nanosheets N1, N2, and N3 included in one nanosheet stack NSS may have different sizes in the first lateral direction (X direction). In other example embodiments, at least some of the first to third nanosheets N1, N2, and N3 may have the same size in the first lateral direction (X direction).

In the PMOS transistor region PA, a plurality of first recesses R1 and a plurality of second recesses R2 may be formed in the fin-type active region FA. As shown in FIG. 2A, a lowermost surface of each of the first recesses R1 and the second recesses R2 may be at a lower vertical level than the fin top surface FT of the fin-type active region FA. As used herein, the term "vertical level" refers to a height from a main surface 102M of the substrate 102 in a vertical direction (Z direction or −Z direction). A first vertical level LV1 of the lowermost surface of each of the plurality of first recesses R1 may be lower than a second vertical level LV2 of the lowermost surface of each of the plurality of second recesses R2. That is, in the vertical direction (Z direction), the first vertical level LV1 of the lowermost surface of each of the plurality of first recesses R1 may be closer to the main surface 102M of the substrate 102 than the second vertical level LV2 of the lowermost surface of each of the plurality of second recesses R2 and be farther from the fin top surface FT of the fin-type active region FA than the second vertical level LV2 of the lowermost surface of each of the plurality of second recesses R2.

A plurality of first source/drain regions 130A may be in the plurality of first recesses R1, respectively, and a plurality of second source/drain regions 130B may be in the plurality of second recesses R2, respectively. Each of the plurality of first source/drain regions 130A and the plurality of second source/drain regions 130B may be adjacent to at least one gate structure 160 selected from the plurality of gate structures 160. Each of the plurality of first source/drain regions 130A and the plurality of second source/drain regions 130B may have a sidewall facing the first to third nanosheets N1, N2, and N3 included in the nanosheet stack NSS adjacent thereto. Each of the plurality of first source/drain regions 130A and the plurality of second source/drain regions 130B may be in contact with the first to third nanosheets N1, N2, and N3 included in the nanosheet stack NSS adjacent thereto.

A PMOS transistor TR1 may be formed at each of intersections between the plurality of fin-type active regions FA and the plurality of gate structures 160 in the PMOS transistor region PA, and an NMOS transistor TR2 may be formed at each of intersections between the plurality of fin-type active regions FA and the plurality of gate structures 160 in the NMOS transistor region NA.

On the substrate 102, some of the plurality of fin-type active regions FA may be arranged at a constant pitch. Some other ones of the plurality of fin-type active regions FA may be formed at variable pitches, so a distance between two adjacent ones of the fin-type active regions FA may depend on a position.

In the PMOS transistor region PA, each of the plurality of first source/drain regions 130A and the plurality of second source/drain regions 130B may include a lower main body layer 132, an upper main body layer 134, and a capping layer 136, which are sequentially stacked in a direction away from the fin-type active region FA in the vertical direction (Z direction). Each of the lower main body layer 132 and the upper main body layer 134 may include a $Si_{1-x}Ge_x$ layer (here, $0.0<x\leq0.6$) doped with a p-type dopant, and a Ge content of the upper main body layer 134 may be higher than a Ge content of the lower main body layer 132. In some example embodiments, a Ge content of the lower main body layer 132 may be more than about 0.0 at % and less than or equal to about 20 at %, for example, being in a range of about 15 at % to about 20 at %. A Ge content of the upper main body layer 134 may be in a range of about 30 at % to about 60 at % (e.g., $0.3<x\leq0.6$)., for example, about 40 at % to about 60 at %. However, the inventive concepts are not limited to the examples described above. In some example embodiments, the p-type dopant may include at least one selected from boron (B) and gallium (Ga), without being limited thereto. In some example embodiments, the capping layer 136 may include an undoped Si layer, a Si layer doped with the p-type dopant, or a SiGe layer having a lower Ge content than the upper main body layer 134.

In the NMOS transistor region NA, a plurality of source/drain regions 130 may be on the plurality of fin-type active regions FA. Each of the plurality of source/drain regions 130 may include a Si layer doped with an n-type dopant or a SiC layer doped with the n-type dopant. The n-type dopant may be selected from phosphorus (P), arsenic (As), and antimony (Sb).

In some example embodiments, in each of the plurality of nanosheet stacks NSS, the first to third nanosheets N1, N2, and N3 may include a semiconductor layer including the same elements. In an example, each of the first to third nanosheets N1, N2, and N3 may include a Si layer. In some example embodiments, the first to third nanosheets N1, N2, and N3 may include an undoped Si layer.

In some example embodiments, the first to third nanosheets N1, N2, and N3 in the PMOS transistor region PA may include a Si layer doped with a dopant of the same conductivity type as that of the first source/drain region 130A and the second source/drain region 130B. In other example embodiments, the first to third nanosheets N1, N2, and N3 in the PMOS transistor region PA may include a Si layer doped with a dopant of a conductivity type opposite to that of the first source/drain region 130A and the second source/drain region 130B. In some example embodiments, the first to third nanosheets N1, N2, and N3 in the NMOS transistor region NA may include a Si layer doped with a dopant of the same conductivity type as that of the source/drain region 130. In other example embodiments, the first to third nanosheets N1, N2, and N3 in the NMOS transistor region NA may include a Si layer doped with a dopant of a conductivity type opposite to that of the source/drain region 130.

Each of the plurality of gate structures 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and arranged between the first to third nanosheets N1, N2, and N3 and between the first nanosheet N1 and the fin-type active region FA, respectively. In the vertical direction (Z direction), a thickness of each of the plurality of sub-gate portions 160S may be less than a thickness of the main gate portion 160M.

Each of the gate structures 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate structures 160 is not limited to the examples described above.

A gate dielectric film 152 may be between the nanosheet stack NSS and the gate structure 160. In some example embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some example embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIGS. 1 and 2A, in the PMOS transistor region PA, the first source/drain region 130A and the second source/drain region 130B may be on the fin-type active region FA with one gate structure 160 therebetween. That is, the gate structure 160 may be on one side of the first source/drain region 130A, and the second source/drain region 130B may be on another side of the gate structure 160. The first source/drain region 130A may be in contact with one sidewall of the nanosheet stack NSS adjacent thereto, and the second source/drain region 130B may be in contact with another sidewall of the nanosheet stack NSS adjacent thereto.

As shown in FIGS. 1 and 2A, in the PMOS transistor region PA, the first source/drain region 130A may have a lowermost surface in contact with the fin-type active region FA at a first vertical level LV1 between the fin top surface FT of the fin-type active region FA and the substrate 102. The second source/drain region 130B may have a lowermost surface in contact with the fin-type active region FA at a second vertical level LV2, which is closer to the fin top surface FT of the fin-type active region FA than the first vertical level LV1. As used herein, the lowermost surface of the first source/drain region 130A may be referred to as a first lowermost surface, and the lowermost surface of the second source/drain region 130B may be referred to as a second lowermost surface.

As shown in FIG. 2B, a greatest width W1 of the first source/drain region 130A may be less than a greatest width W2 of the second source/drain region 130B in a second lateral direction (Y direction).

As shown in FIG. 1, in the NMOS transistor region NA, a greatest width of the source/drain region 130 in the second lateral direction (Y direction) may be substantially equal to the greatest width W1 of the first source/drain region 130A in the PMOS transistor region PA. The greatest width of the source/drain region 130 in the second lateral direction (Y direction) may be less than the greatest width W2 of the second source/drain region 130B in the PMOS transistor region PA.

As shown in FIGS. 1 and 2C, in the PMOS transistor region PA, the plurality of fin-type active regions FA may include a plurality of pairs of fin-type active regions FA, which are apart from each other in the first lateral direction (X direction) with one separation region AP therebetween. For example, as shown in FIG. 2C, the plurality of fin-type active regions FA may include a pair of fin-type active regions FA including a first fin-type active region FA_1 and a second fin-type active region FA_2, which are apart from each other in the first lateral direction (X direction) with one separation region AP therebetween, and a pair of fin-type active regions FA including a third fin-type active region FA_3 and a fourth fin-type active region FA_4, which are apart from each other in the first lateral direction (X direction) with one separation region AP therebetween.

The third fin-type active region FA_3 may be apart from the first fin-type active region FA_1, the second fin-type active region FA_2, and the separation region AP between the first and second fin-type active regions FA_1 and FA_2 in the second lateral direction (Y direction). The first source/drain region 130A and the second source/drain region 130B may be on the third fin-type active region FA_3. The first source/drain region 130A on the third fin-type active region FA_3 may be adjacent to the first source/drain region 130A on the first fin-type active region FA_1 in the second lateral direction (Y direction) and face the first fin-type active region FA_1 in the second lateral direction (Y direction). The second source/drain region 130B on the third fin-type active region FA_3 may be adjacent to the separation region AP in the second lateral direction (Y direction) and face the separation region AP in the second lateral direction (Y direction). As used herein, the first source/drain region 130A on the third fin-type active region FA_3 may be referred to as a third source/drain region, and the second source/drain region 130B on the third fin-type active region FA_3 may be referred to as a fourth source/drain region. The first source/drain region 130A located on the third fin-type active region FA_3 and the second source/drain region 130B located on the third fin-type active region FA_3 may and substantially have the same configurations as the first source/drain region 130A and the second source/drain region 130B, respectively, which have been described with reference to FIGS. 2A and 2B.

In the IC device 100, the fin-type active region FA may not be in a plurality of separation regions AP. Accordingly, none of the nanosheet stack NSS, the first source/drain region 130A, and the second source/drain region 130B may not be in the plurality of separation regions AP.

As shown in FIGS. 1 and 2C, the plurality of fin-type active regions FA may include a fifth fin-type active region FA_5 in the NMOS transistor region NA. The fifth fin-type active region FA_5 may be apart from the first fin-type active region FA_1 in the PMOS transistor region PA in the second lateral direction (Y direction) (e.g., in a forward direction or an upward direction of FIGS. 1 and 2C) and have a greater length than the first fin-type active region FA_1 in the first lateral direction (X direction).

The plurality of fin-type active regions FA may include a sixth fin-type active region FA_6 in the NMOS transistor region NA. The sixth fin-type active region FA_6 may be apart from the first fin-type active region FA_1 in the PMOS transistor region PA in the second lateral direction (Y direction) (e.g., in a reverse direction or a downward direction of FIGS. 1 and 2C) and have a greater height than the first fin-type active region FA_1 in the first lateral direction (X direction). In other words, the fifth fin-type active region FA_5 and the sixth fin-type active region FA_6 being opposite to each other with reference to the first fin-type active region FA_1.

A plurality of source/drain regions 130 may be on the fifth fin-type active region FA_5. The plurality of source/drain regions 130 on the fifth fin-type active region FA_5 may include the source/drain region 130, which is apart from the second source/drain region 130B in the PMOS transistor region PA with the separation region AP therebetween in the second lateral direction (Y direction), is on a straight line with the second source/drain region 130B located in the PMOS transistor region PA, and extends in the second lateral direction (Y direction) together with the second source/drain region 130B located in the PMOS transistor region PA. As used herein, the source/drain region 130, which is on the fifth fin-type active region FA_5, is on a straight line with the second source/drain region 130B located in the PMOS transistor region PA and extends in the second lateral direction (Y direction) together with the second source/drain region 130B located in the PMOS transistor region PA, may be referred to as a fifth source/drain region.

The plurality of source/drain regions 130 may be on the sixth fin-type active region FA_6. The plurality of source/drain regions 130 on the sixth fin-type active region FA_6 may include the source/drain region 130, which is on a straight line with the second source/drain region 130B located in the PMOS transistor region PA, and extends in the second lateral direction (Y direction) together with the second source/drain region 130B located in the PMOS transistor region PA. As used herein, the source/drain region 130, which is on the sixth fin-type active region FA_6, is on a straight line with the second source/drain region 130B located in the PMOS transistor region PA, and extends in the second lateral direction (Y direction) together with the second source/drain region 130B located in the PMOS transistor region PA, may be referred to as a sixth source/drain region.

In the second lateral direction (Y direction), a shortest distance SL1 between the second source/drain region 130B in the PMOS transistor region PA and the fifth source/drain region may be greater than a shortest distance SL2 between the second source/drain region 130B in the PMOS transistor region PA and the sixth source/drain region. In the second lateral direction (Y direction), a shortest distance FL1 between the first fin-type active region FA_1 in the PMOS transistor region PA and the fifth fin-type active region FA_5 in the NMOS transistor region NA may be greater than a shortest distance FL2 between the first fin-type active region FA_1 in the PMOS transistor region PA and the sixth fin-type active region FA_6 in the NMOS transistor region NA.

With regard to detailed configurations of the third fin-type active region FA_3 shown in FIG. 2C, the plurality of nanosheet stacks NSS located on the third fin-type active region FA_3, the gate structure 160 located on the third fin-type active region FA_3, and the first and second source/drain regions 130A and 130B located on the third fin-type active region FA_3 may be the same as those described with reference to FIGS. 2A and 2B. The first source/drain region 130A on the third fin-type active region FA_3 may be in contact with one sidewall of the nanosheet stack NSS on the third fin-type active region FA_3. The second source/drain region 130B on the third fin-type active region FA_3 may be in contact with another sidewall of the nanosheet stack NSS on the third fin-type active region FA_3 and be adjacent to the separation region AP in the second lateral direction (Y direction). In the second lateral direction (Y direction), the greatest width W1 of the first source/drain region 130A on the third fin-type active region FA_3 may be less than the greatest width W2 of the second source/drain region 130B on the third fin-type active region FA_3.

As shown in FIG. 1, a local region adjacent to the separation region AP may constitute a dummy gate 160D in each of the plurality of gate structures 160. In some example embodiments, of each of the plurality of gate structures 160, portions that are apart from each other with the dummy gate 160D therebetween may be electrically separable from each other by the dummy gate 160D.

As shown in FIG. 2A, a first recess R1 and a second recess R2 may be on both sides of the gate structure 160 in each of the plurality of fin-type active regions FA. The first recess R1 may be filled with the first source/drain region 130A. A bottom surface of the first recess R1 may provide an interface between the first source/drain region 130A and the fin-type active region FA. The second recess R2 may be filled with the second source/drain region 130B. A bottom surface of the second recess R2 may provide an interface between the second source/drain region 130B and the fin-type active region FA. Respective uppermost surfaces of the first source/drain region 130A and the second source/drain region 130B may be at substantially the same vertical level as each other.

As shown in FIG. 2A, a plurality of outer insulating spacers 118 covering both sidewalls of the gate structure 160 may be on the fin-type active region FA and the device isolation film 114. The plurality of outer insulating spacers 118 may cover the main gate portion 160M on top surfaces of the plurality of nanosheet stacks NSS. Each of the plurality of outer insulating spacers 118 may be apart from the gate structure 160 with the gate dielectric film 152 therebetween. A top surface of each of the gate dielectric layer 152, the gate structures 160, and the outer insulating spacers 118 may be covered by a capping insulating pattern 164. The capping insulating pattern 164 may include a silicon nitride film.

As shown in FIG. 2B, the IC device 100 may include first recess-side insulating spacers 119A and second recess-side insulating spacers 119B. The first recess-side insulating spacers 119A may cover both sidewalls of a portion of the fin-type active region FA between the device isolation film 114 and the first source/drain region 130A. The second recess-side insulating spacers 119B may cover both sidewalls of a portion of the fin-type active region FA between the device isolation film 114 and the second source/drain region 130B.

The first recess-side insulating spacers 119A may be in contact with a lower portion of the first source/drain region 130A, and the second recess-side insulating spacer 119B may be apart from the second source/drain region 130B in the vertical direction (Z direction). In the vertical direction (Z direction), a first height H1 of the first recess-side insulating spacer 119A may be greater than a second height H2 of the second recess-side insulating spacer 119B. A vertical level of an uppermost portion of the first recess-side insulating spacer 119A may be higher than the first vertical level LV1 of the lowermost surface of the first source/drain region 130A. A vertical level of an uppermost portion of the second recess-side insulating spacer 119B may be lower than the second vertical level LV2 of the lowermost surface of the second source/drain region 130B. In some example embodiments, each of the first recess-side insulating spacer 119A and the second recess-side insulating spacer 119B may be integrally connected to an outer insulating spacer 118 adjacent thereto.

Each of the plurality of outer insulating spacers 118, the first recess-side insulating spacer 119A, and the second recess-side insulating spacers 119B may include silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiN," "SiO," "SiCN," "SiBN," "SiON," "SiOCN," "SiBCN," and "SiOC" refers to a material including elements included therein, without referring to a chemical formula representing a stoichiometric relationship.

As shown in FIG. 2A, each of the first source/drain region 130A and the second source/drain regions 130B may include a portion, which overlaps the outer insulating spacer 118 in the vertical direction (Z direction). For example, a portion of each of the first source/drain region 130A and the second source/drain region 130B, which overlaps the outer insulating spacer 118 in the vertical direction (Z direction), may have a width ranging from about 0 nm to about 4 nm in the first lateral direction (X direction), without being limited thereto.

As shown in FIGS. 2A and 2B, each of the first source/drain region 130A, the second source/drain region 130B, the plurality of outer insulating spacers 118, the first recess-side insulating spacer 119A, and the second recess-side insulating spacer 119B may be covered by an insulating liner 142. The insulating liner 142 may include SiN, SiO, SiCN, SiBN, SiON, SiOCN, SiBCN, SiOC, or a combination thereof. An inter-gate dielectric film 144 may be on the insulating liner 142. The inter-gate dielectric film 144 may include a silicon nitride film, a silicon oxide film, SiON, SiOCN, or a combination thereof. In some example embodiments, the insulating liner 142 may be omitted.

The IC device 100 described with reference to FIGS. 1 and 2A to 2C may include a plurality of first source/drain regions 130A and a plurality of second source/drain regions 130B, which have sizes and configurations controlled to provide desired performance depending on a position on the substrate 102. Accordingly, the performance of the PMOS transistor TR1 included in the PMOS transistor region PA may be improved. Also, a structure that is advantageous for increasing the operating speed of the PMOS transistor TR1 by increasing stress applied to the nanosheet stack NSS included in the PMOS transistor region PA may be implemented. Therefore, the performance and reliability of the IC device 100 may be improved.

Figure 3:
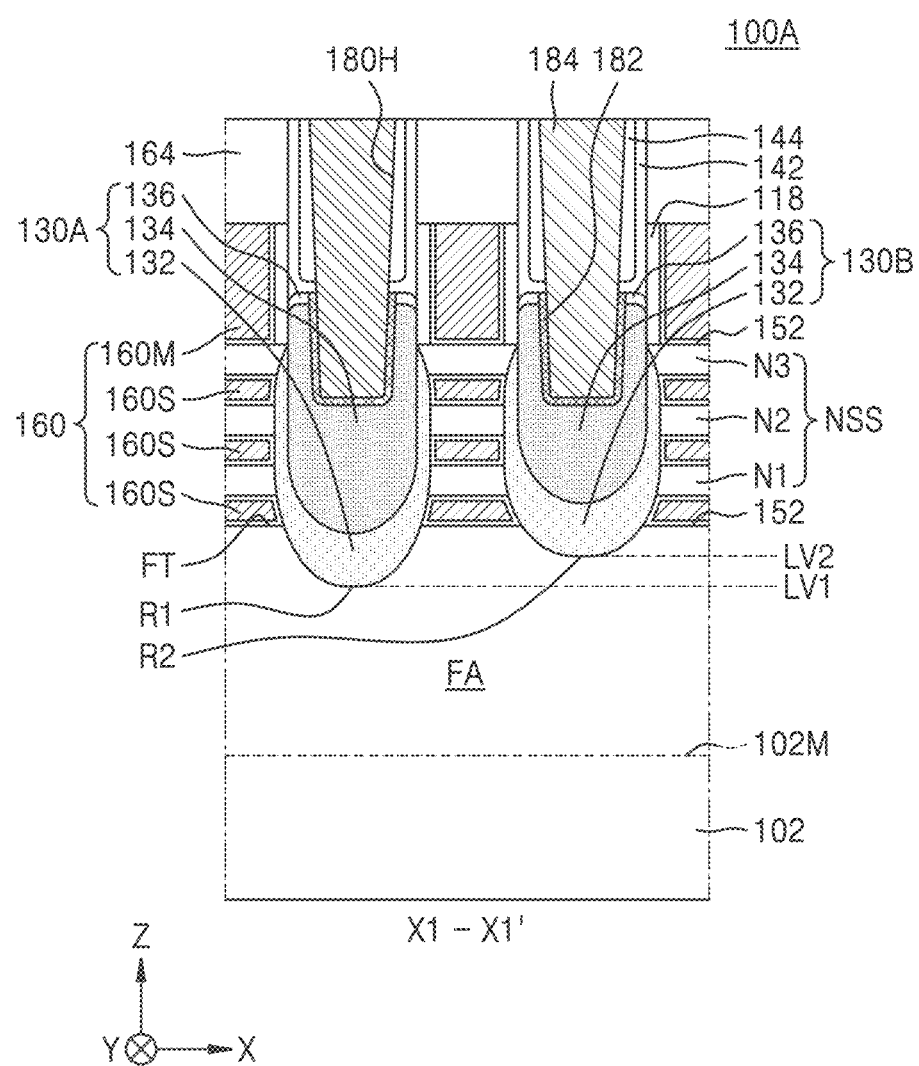
FIG. 3 is a cross-sectional view of an IC device according to an example embodiments.

FIG. 3 is a cross-sectional view of an IC device 100A according to an example embodiment. FIG. 3 illustrates some components in a portion corresponding to a cross-section taken along line X1-X1' of FIG. 1. In FIG. 3, the same reference numerals are used to denote the same elements as in FIGS. 1 and 2A to 2C, and detailed descriptions thereof are omitted.

Referring to FIG. 3, the IC device 100A may have substantially the same configuration as the IC device 100 described with reference to FIGS. 1 and 2A to 2C. However, the IC device 100A may further include a plurality of source/drain contacts 184 on a first source/drain region 130A and a second source/drain region 130B. Each of the plurality of source/drain contacts 184 may extend long in a vertical direction (Z direction) between a pair of gate structures, which are adjacent to each other, from among a plurality of gate structures 160. A metal silicide film 182 may be between the first and source/drain regions 130A and 130B and the source/drain contact 184.

Each of the plurality of source/drain contacts 184 may fill the inside of a contact hole 180H, which passes through the inter-gate dielectric film 144 and the insulating liner 142 in the vertical direction (Z direction) and extends into each of the first source/drain region 130A and the second source/drain region 130B. Each of the first source/drain region 130A and the second source/drain region 130B may be apart from the source/drain contact 184 with the metal silicide film 182 therebetween. Each of the first source/drain region 130A and the second source/drain region 130B may surround a lower portion of each of the plurality of source/drain contacts 184 outside the contact hole 180H.

In some example embodiments, the metal silicide film 182 may include titanium silicide, without being limited thereto. In some example embodiments, the metal silicide film 182 may be omitted. In some example embodiments, each of the plurality of source/drain contacts 184 may include a metal, a conductive metal nitride, or a combination thereof. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof.

Figure 4:
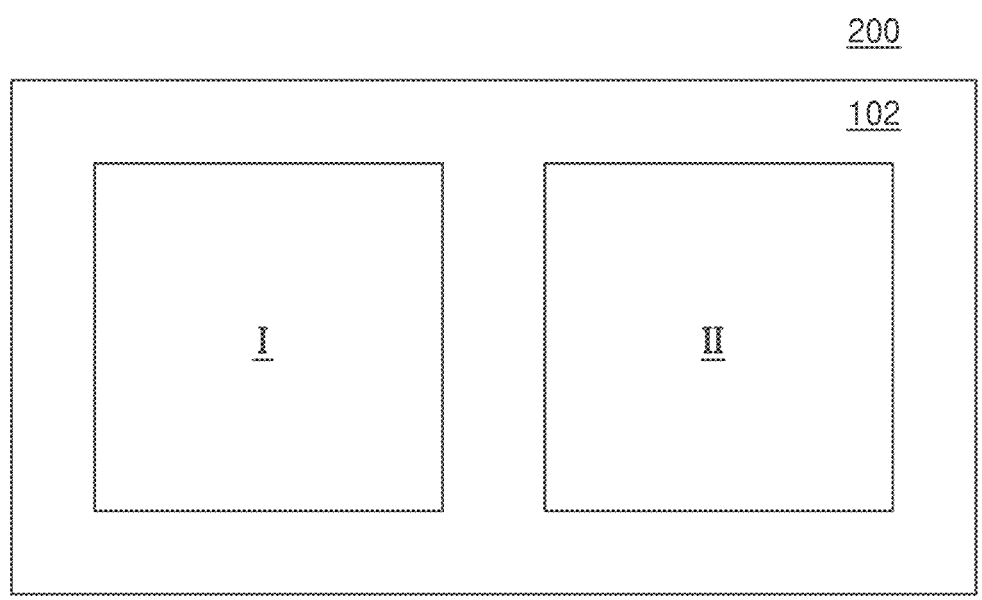
FIG. 4 is a block diagram of an IC device according to an example embodiment.

FIG. 4 is a block diagram of an IC device 200 according to an example embodiment.

Referring to FIG. 4, the IC device 200 may include a substrate 102 having a first region I and a second region II. The first region I and the second region II of the substrate 102 may refer to different regions of the substrate 102 and may be regions configured to perform different operations on the substrate 102. The first region I and the second region II may be apart from each other in a lateral direction.

In some example embodiments, at least one of the first region I and the second region II may be a region in which devices configured to operate in a low-power mode are formed. In other example embodiments, at least one of the first region I and the second region II may be a region in which devices configured to operate in a high-power mode are formed. In still other example embodiments, at least one of the first region I and the second region II may be a region in which a memory device or a non-memory device is formed. In yet other example embodiments, at least one of the first region I and the second region II may be a region in which a peripheral circuit (e.g., an input/output (I/O) device) is formed In some example embodiments, at least one of the first region I and the second region II may constitute a volatile memory device, such as dynamic random access memory (DRAM) and static RAM (SRAM), or a non-volatile memory device, such as read-only memory (ROM), mask ROM (MROM), programmable ROM (PROM), erasable programmable ROM (EPROM), electrically erasable programmable ROM (EEPROM), ferromagnetic ROM (FROM), phase-change RAM (PRAM), magnetic RAM (MRAM), resistive RAM (RRAM), and flash memory. In other example embodiments, at least one of the first region I and the second region II may be a region in which a non-memory device (e.g., a logic device) is formed. The logic device may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch.

In the IC device 200, each of the first region I and the second region II may include at least one selected from the structures of the IC device 100 and 100A, which have been described with reference to FIGS. 1, 2A to 2C, and 3. However, a width of a nanosheet stack in the second region II may be greater than a width of a nanosheet stack in the first region I.

Figure 5A:
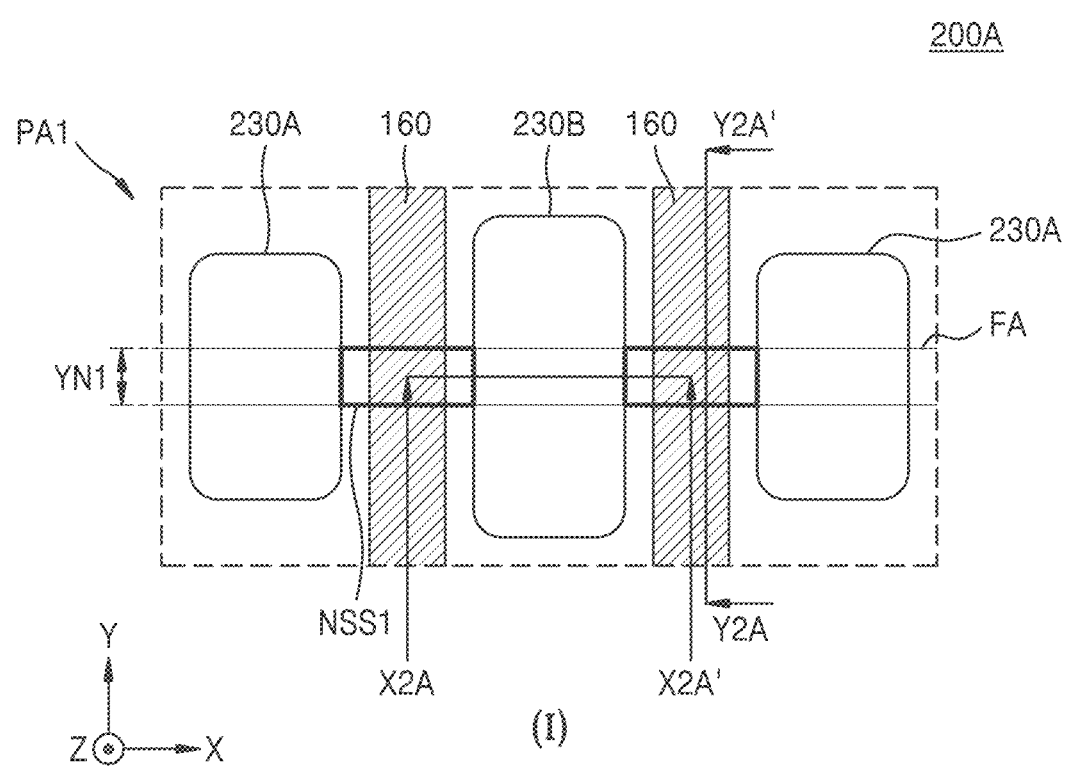
FIGS. 5A and 5B are plan layout diagrams of an IC device according to an example embodiment.
Figure 5B:
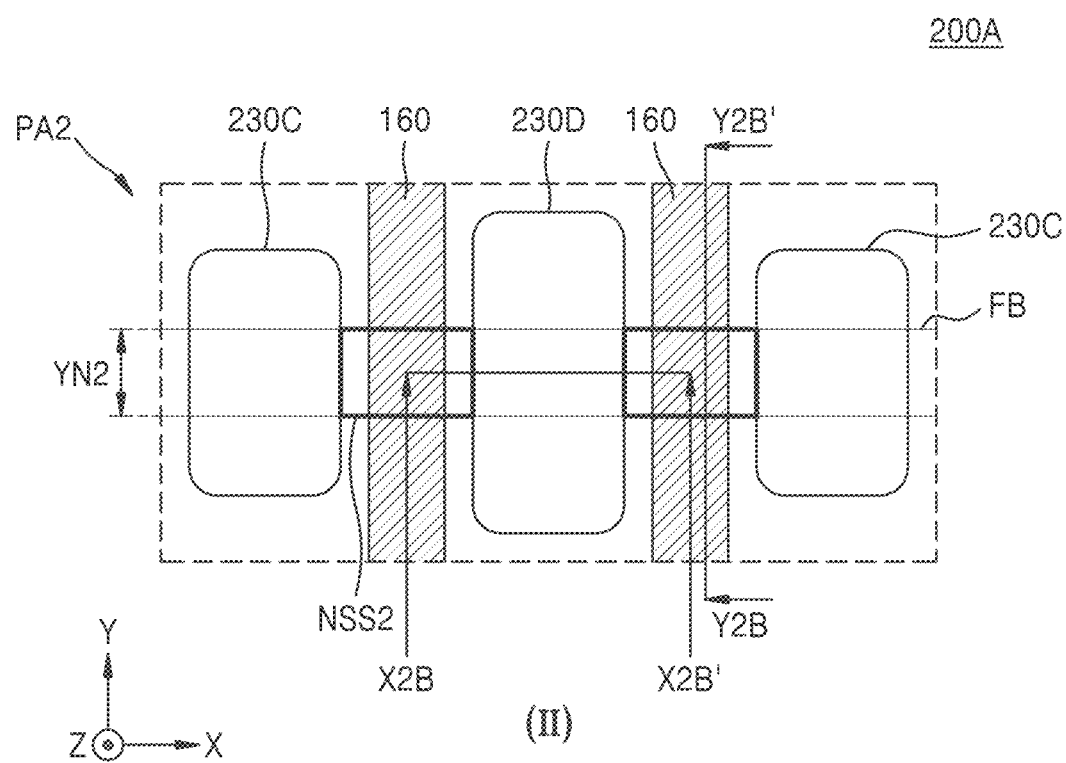
Figure 6:
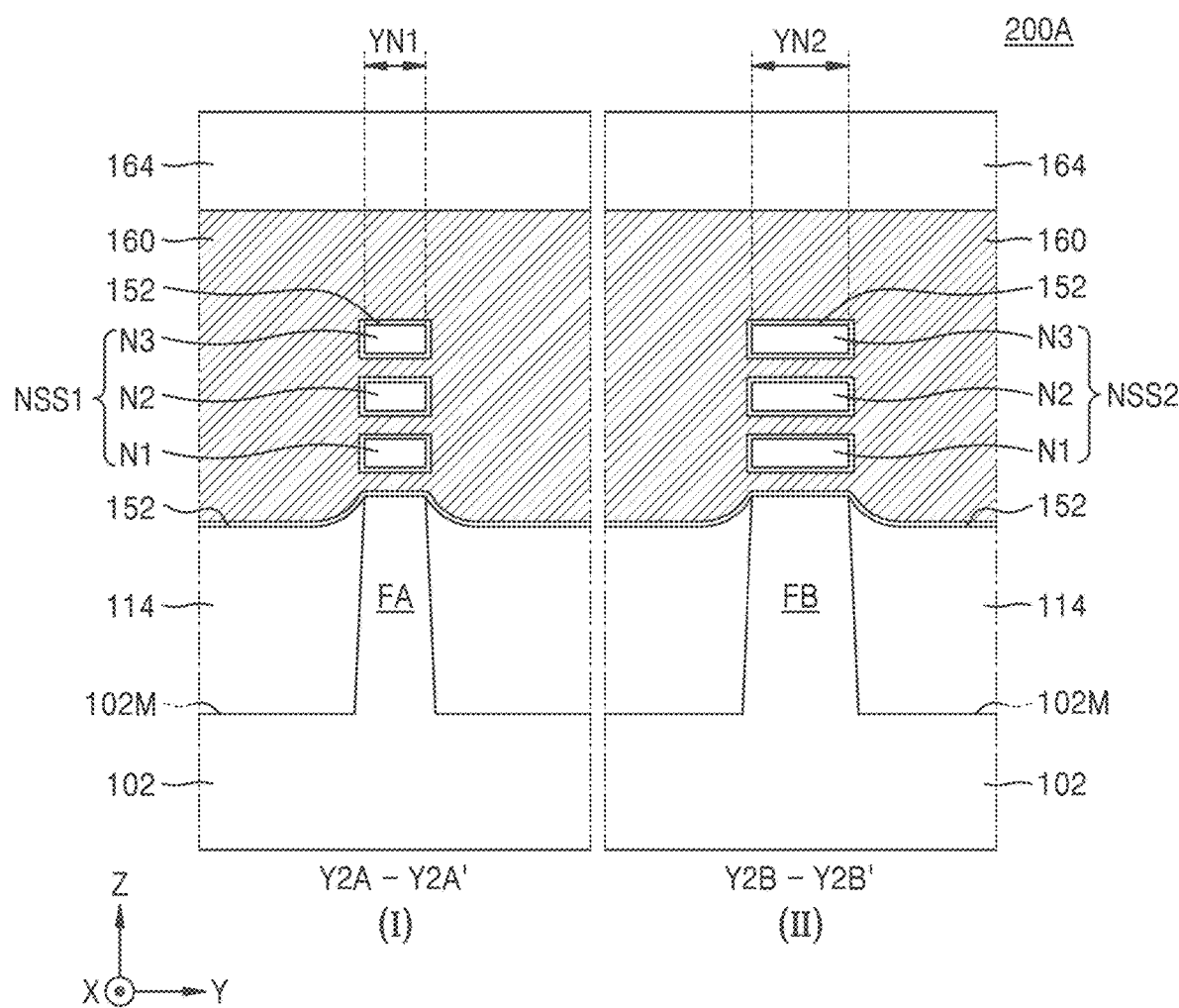
FIG. 6 shows cross-sectional views of components, which are taken along lines Y2A-Y2A' of FIG. 5A and Y2B-Y2B' of FIG. 5B, respectively.
Figure 7:
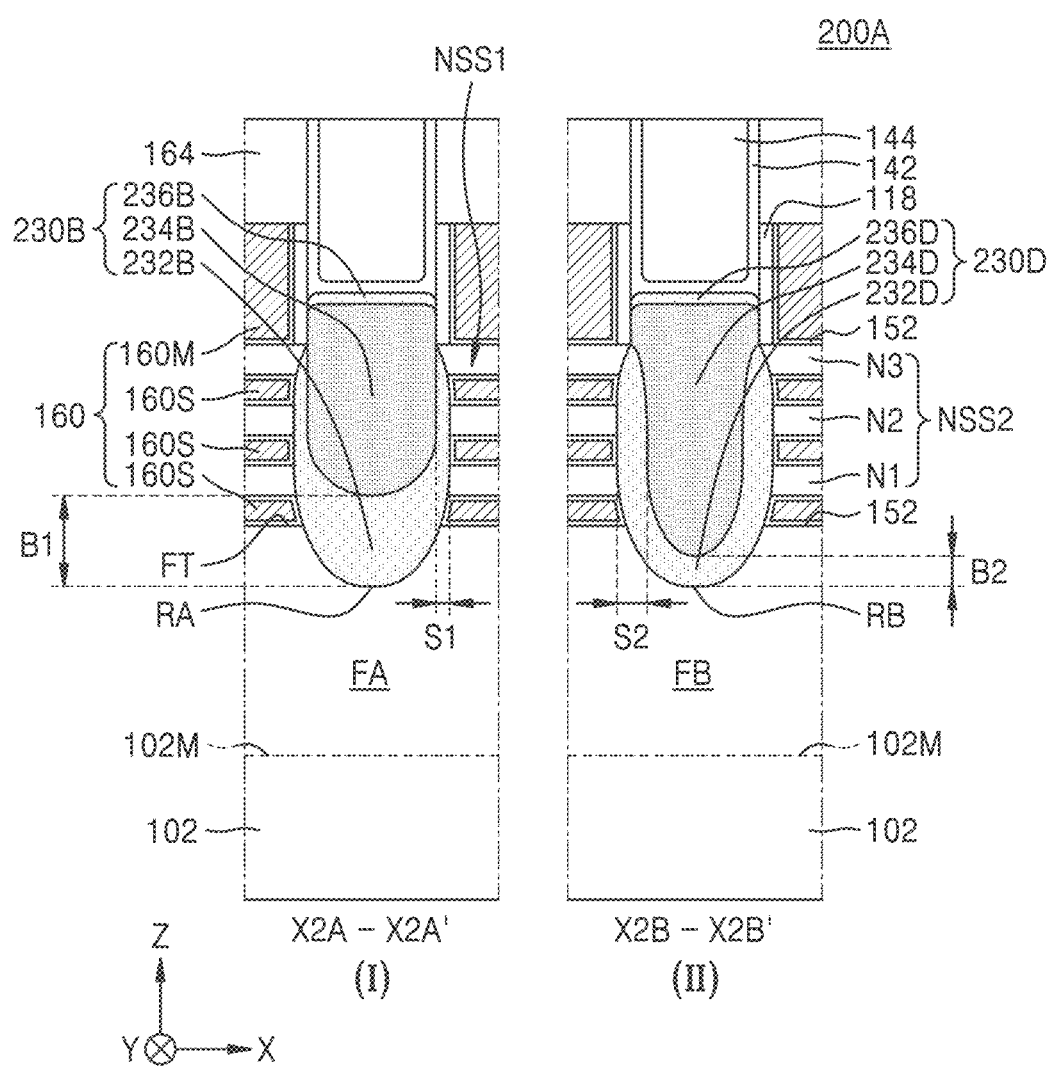
FIG. 7 shows cross-sectional views of cross-sectional configurations respectively taken along line X2A-X2A' of FIG. 5A and line X2B-X2B' of FIG. 5B, respectively.

FIGS. 5A and 5B are plan layout diagrams of an IC device 200A according to an example embodiment. FIGS. 5A and 5B illustrate cross-sectional configurations of the IC device 200A, according to specific embodiments of the IC device 200 shown in FIG. 4. FIG. 6 shows cross-sectional views of components, which are taken along lines Y2A-Y2A' of FIG. 5A and Y2B-Y2B' of FIG. 5B, respectively. FIG. 7 shows cross-sectional views of cross-sectional configurations respectively taken along line X2A-X2A' of FIG. 5A and line X2B-X2B' of FIG. 5B, respectively. FIGS. 5A and 5B illustrate enlarged components in a portion corresponding to a local region "EX2" of FIG. 1.

Referring to FIGS. 5A, 5B, 6, and 7, a first PMOS transistor region PA1 may be in a first region I, and a second PMOS transistor region PA2 may be in a second region II. In the IC device 200A, each of the first PMOS transistor region PA1 of the first region I and the second PMOS transistor region PA2 of the second region II may include a structure having the same structure as that described with reference to FIGS. 1 and 2A to 2C. However, a first-type active region FA and a first nanosheet stack NSS1 may be in the first region I. The first nanosheet stack NSS1 may be on the fin-type active region FA and has a first width YN1 in a second lateral direction (Y direction). A broad fin-type active region FB having a greater width than the fin-type active region FA may be in the second region II. In the second region II, a second nanosheet stack NSS2 may be on the broad fin-type active region FB. The second nanosheet stack NSS2 may have a second width YN2 in the second lateral direction (Y direction). The second width YN2 may be greater than the first width YN1. As used herein, the second nanosheet stack NSS2 may be referred to as a broad nanosheet stack. In addition, each of a first nanosheet N1, a second nanosheet N2, and a third nanosheet N3 in the second nanosheet stack NSS2 may be referred to as a broad nanosheet. In some example embodiments, the first width YN1 may be selected in a range of about 5 nm to about 25 nm, and the second width YN2 may be selected in a range of about 26 nm to about 45 nm, but the inventive concepts are not limited thereto.

A detailed configuration of the broad fin-type active region FB may be substantially the same as that of the fin-type active region FA, which has been described with reference to FIGS. 1 and 2A to 2C. A detailed configuration of each of the first nanosheet stack NSS1 and the second nanosheet stack NSS2 may be substantially the same as that of the nanosheet stack NSS, which has been described with reference to FIGS. 2A and 2B.

As shown in FIGS. 5A, 6, and 7, a plurality of gate structures 160 may be on the fin-type active region FA in the first region I. As shown in FIG. 5A, a first source/drain region 230A and a second source/drain region 230B having different widths in the second lateral direction (Y direction) may be on the fin-type active region FA. Detailed configurations of the first source/drain region 230A and the second source/drain region 230B may be substantially the same as those of the first source/drain region 130A and the second source/drain region 130B, which have been described with reference to FIGS. 1, 2A, and 2B.

As shown in FIG. 7, a first recess RA may be adjacent to the gate structure 160 in the fin-type active region FA in the first region I. The first recess RA may be filled with the second source/drain region (see 230B in FIGS. 5A and 7). In other example embodiments, in the first region I, the first recess RA may be filled with the first source/drain region 230A.

As shown in FIGS. 5A, 6, and 7, a plurality of gate structures 160 may be on the broad fin-type active region FB in the second region II. As shown in FIG. 5B, a third source/drain region 230C and a fourth source/drain region 230D having different widths from each other in the second lateral direction (Y direction) may be on the broad fin-type active region FB. Detailed configurations of the third source/drain region 230C and the fourth source/drain region 230D may be substantially the same as those of the first source/drain region 130A and the second source/drain region 130B, which have been described with reference to FIGS. 1, 2A, and 2B.

As shown in FIG. 7, a second recess RB may be adjacent to the gate structure 160 on the broad fin-type active region FB in the second region II. The second recess RB may be filled with the fourth source/drain region (see 230D in FIGS. 5B and 7). In other example embodiments, in the second region II, the second recess RB may be filled with the third source/drain region 230C.

Referring to FIG. 7, the second source/drain region 230B in the first region I may include a lower main body layer 232B, an upper main body layer 234B, and a capping layer 236B, which are sequentially stacked in a direction away from the fin-type active region FA in a vertical direction (Z direction). Each of the lower main body layer 232B and the upper main body layer 234B may include a $Si_{1-x}Ge_x$ layer (here, $0.0<x\leq0.6$) doped with a p-type dopant, and a Ge content of the upper main body layer 234B may be higher than a Ge content of the lower main body layer 232B. The capping layer 236B may include an undoped Si layer, a Si layer doped with the p-type dopant, or a SiGe layer having a lower Ge content than the upper main body layer 234B. Detailed configurations of the lower main body layer 232B, the upper main body layer 234B, and the capping layer 236B may be substantially the same as those of the lower main body layer 132, the upper main body layer 134, and the capping layer 136, which have been described with reference to FIGS. 1, 2A, and 2B.

As shown in FIG. 7, the fourth source/drain region 230D in the second region II may include a lower main body layer 232D, an upper main body layer 234D, and a capping layer 236D, which are sequentially stacked in a direction away from the broad fin-type active region FB in a vertical direction (Z direction). Each of the lower main body layer 232D and the upper main body layer 234D may include a $Si_{1-x}Ge_x$ layer (here, $0.0<x\leq0.6$) doped with a p-type dopant, and a Ge content of the upper main body layer 234D may be higher than a Ge content of the lower main body layer 232D. In some example embodiments, the upper main body layer 234D may include a $Si_{1-x}Ge_x$ layer (here, $0.3<x\leq0.6$). The capping layer 236D may include at least one of an undoped Si layer, a Si layer doped with the p-type dopant, or a SiGe layer having a lower Ge content than the upper main body layer 234D. Detailed configurations of the lower main body layer 232D, the upper main body layer 234D, and the capping layer 236D may be substantially the same as those of the lower main body layer 132, the upper main body layer 134, and the capping layer 136, which have been described with reference to FIGS. 1, 2A, and 2B.

In the IC device 200A, a thickness S2 of a side portion (e.g., a side sub-portion of a surrounding portion) of the lower main body layer 232D, which is in the fourth source/drain region 230D in the second region II and adjacent to the second nanosheet stack NSS2, may be greater than a thickness S1 of a side portion (e.g., a side sub-portion of a surrounding portion) of the lower main body layer 232B, which is in the second source/drain region 230B in the first region I and adjacent to the first nanosheet stack NSS1. In the IC device 200A, a thickness B2 of a bottom portion (e.g., a bottom sub-portion of the surrounding portion) of the lower main body layer 232D, which is in the fourth source/drain region 230D in the second region II and in contact with the broad fin-type active region FB, may be less than a thickness B1 of a bottom portion (e.g., a bottom sub-portion of the surrounding portion) of the lower main body layer 232B, which is in the second source/drain region 230B in the first region I and in contact with the fin-type active region FA.

In other words, the lower main body layer of the fourth source/drain region 232D adjacent to the broad nanosheet stack may include a core sub-portion and a surrounding sub-portion that includes a side portion and a bottom portion in contact with the broad fin-type active region. The lower main body layer of at least one of the first source/drain region 230A and the second source/drain region 230B that is adjacent to the first nanosheet stack NSS1 may include a core portion and a surrounding portion that includes a side sub-portion and a bottom sub-portion in contact with the first fin-type active region FA_1. A thickness of the side sub-portion of the lower main body layer of the fourth source/drain region 230D may be greater than a thickness of the side sub-portion of the lower main body layer of at least one of the first source/drain region 230A and the second source/drain region 230B. The thickness of the bottom sub-portion of the lower main body layer of the fourth source/drain region 230D may be less than a thickness of the bottom portion of the lower main body layer of at least one of the first source/drain region 230A and the second source/drain region 230B.

Referring to FIGS. 5A, 5B, 6, and 7, in the IC device 200A, because the thickness B1 of the bottom portion (e.g., a bottom sub-portion of a surrounding portion) of the lower main body layer 232B, which is in the second source/drain region 230B in the first region I and in contact with the fin-type active region FA, is relatively great, a distance between the fin-type active region FA and the upper main body layer 234B having a relatively high Ge content may become relatively great. Accordingly, the occurrence of a leakage current flowing through the fin-type active region FA may be inhibited or mitigated in a PMOS transistor including the second source/drain region 230B in the first region I. In addition, the thickness S1 of the side portion (e.g., a side sub-portion of the surrounding portion) of the lower main body layer 232B, which is in the second source/drain region 230B and adjacent to the first nanosheet stack NSS1, may kept at a minimum or a relatively small thickness as not to degrade the performance of the PMOS transistor including the second source/drain region 230B. Thus, the performance of a PMOS transistor including the first width YN1, which is a relatively small width, in the second lateral direction (Y direction) may be improved, and a structure capable of ensuring different electrical properties desired by respective PMOS transistors in the first region I and the second region II may be provided.

Figure 8:
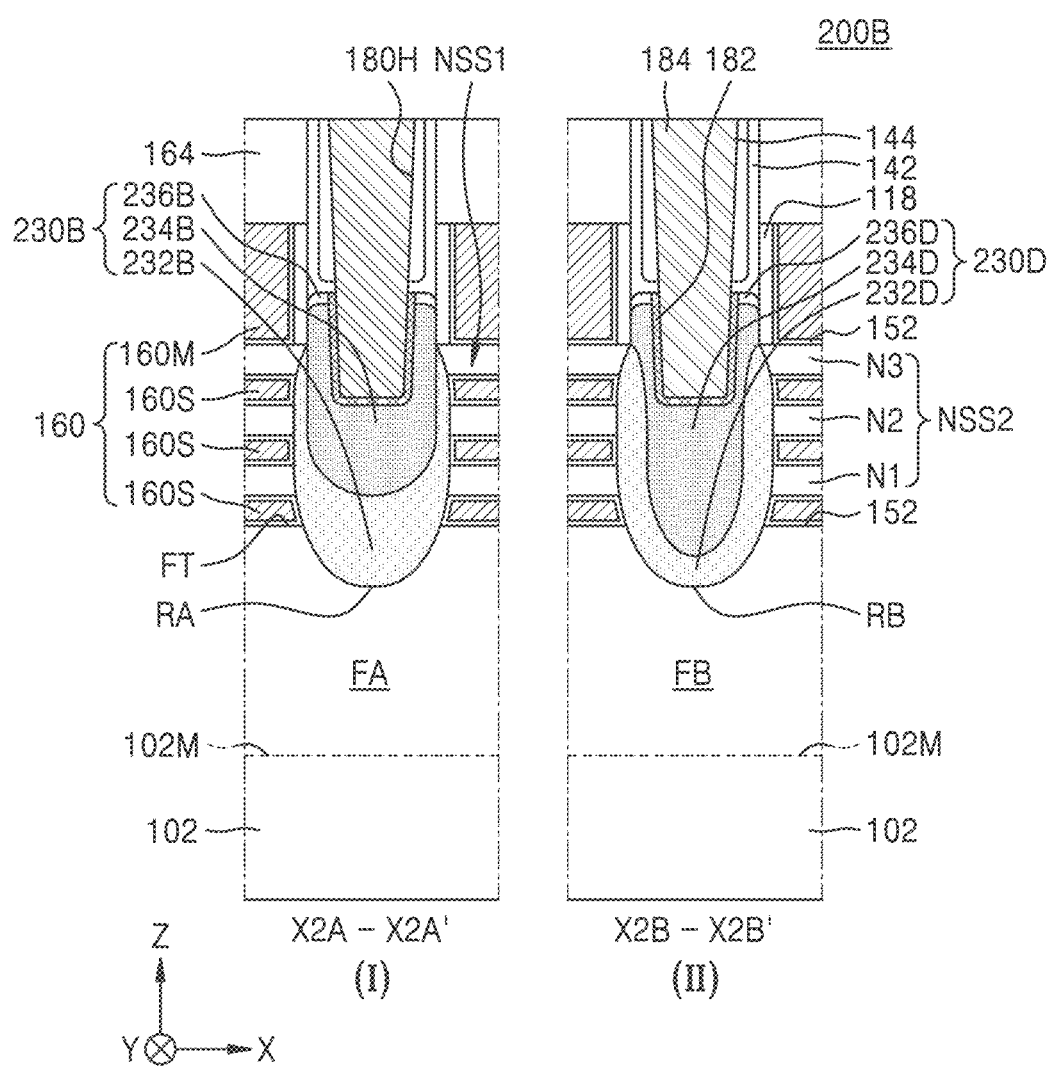
FIG. 8 is a cross-sectional view of an IC device according to an example embodiment.

FIG. 8 is a cross-sectional view of an IC device 200B according to an example embodiment. FIG. 8 illustrates components in portions corresponding to cross-sections taken along line X2A-X2A' of FIG. 5A and X2B-X2B' of FIG. 5B. In FIG. 8, the same reference numerals are used to denote the same elements as in FIGS. 1, 2A to 2C, and 7, and detailed descriptions thereof are omitted.

Referring to FIG. 8, the IC device 200B may have substantially the same configuration as the IC device 200A described with reference to FIGS. 5A, 5B, 6, and 7. However, the IC device 200B may further include a plurality of source/drain contacts 184 on a second source/drain region 230B in a first region I and a fourth source/drain region 230D in a second region II. A metal silicide film 182 may be between the second and fourth source/drain regions 230B and 230D and the source/drain contact 184. Detailed configurations of the source/drain contact 184 and the metal silicide film 182 may be the same as those described with reference to FIG. 3.

Figure 9A:
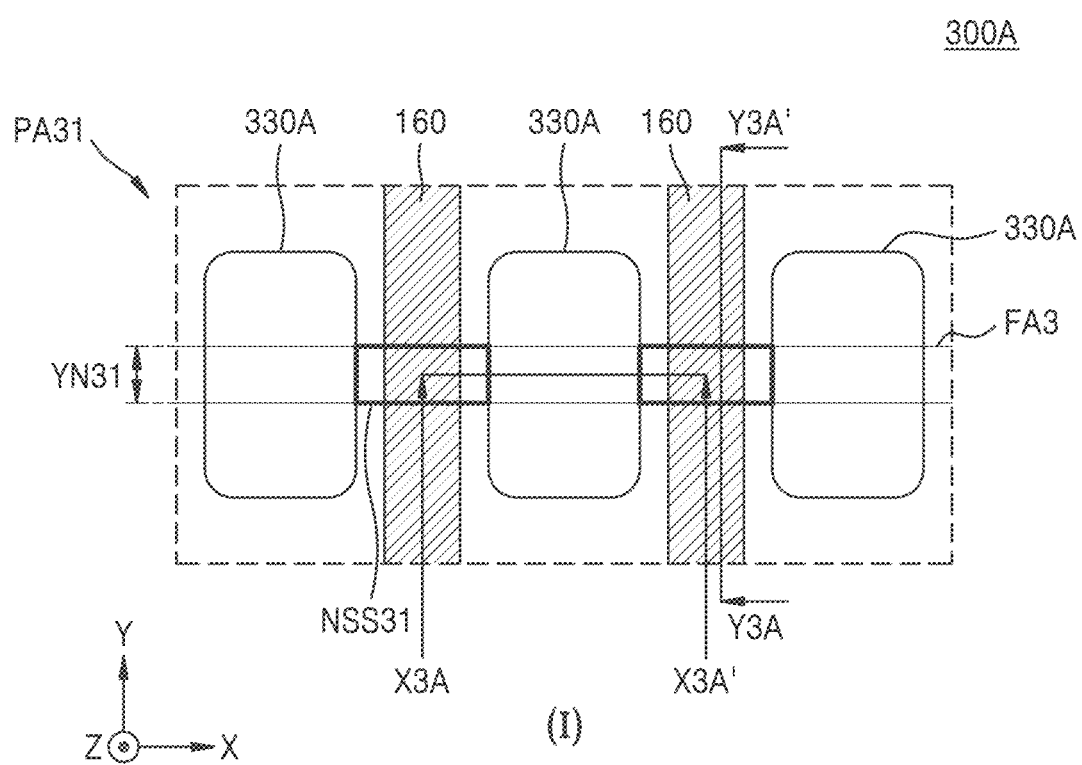
FIGS. 9A and 9B are plan layout diagrams of an IC device according to an example embodiment.
Figure 9B:
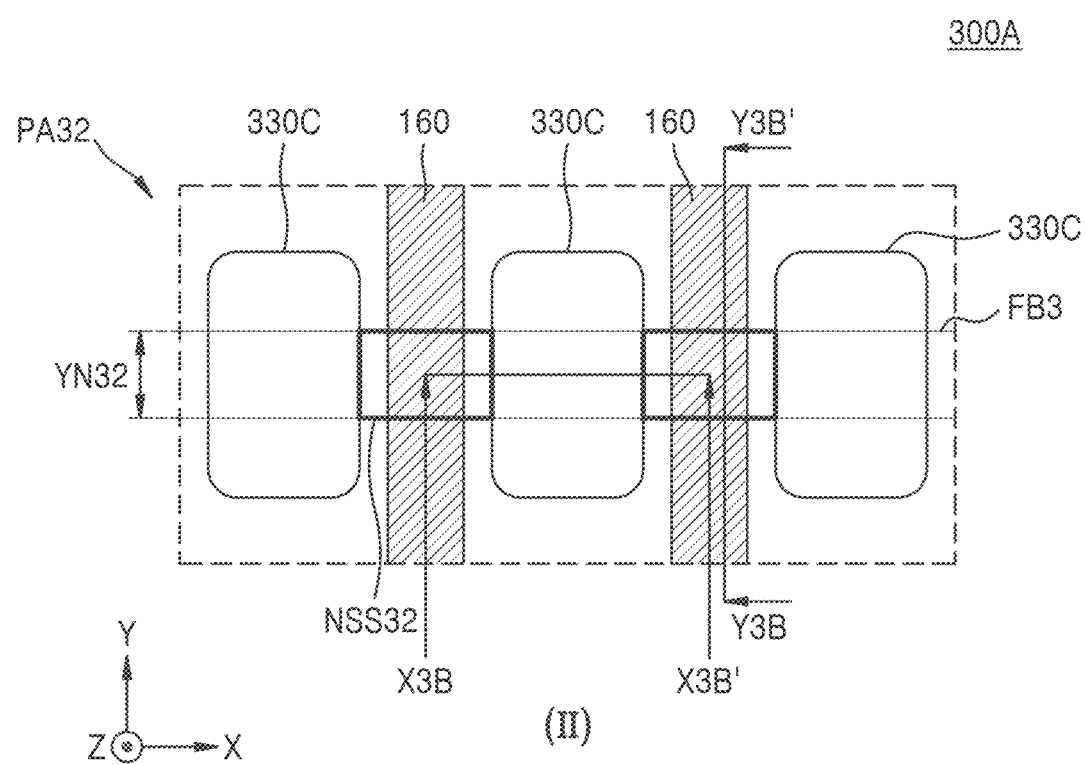
Figure 10:
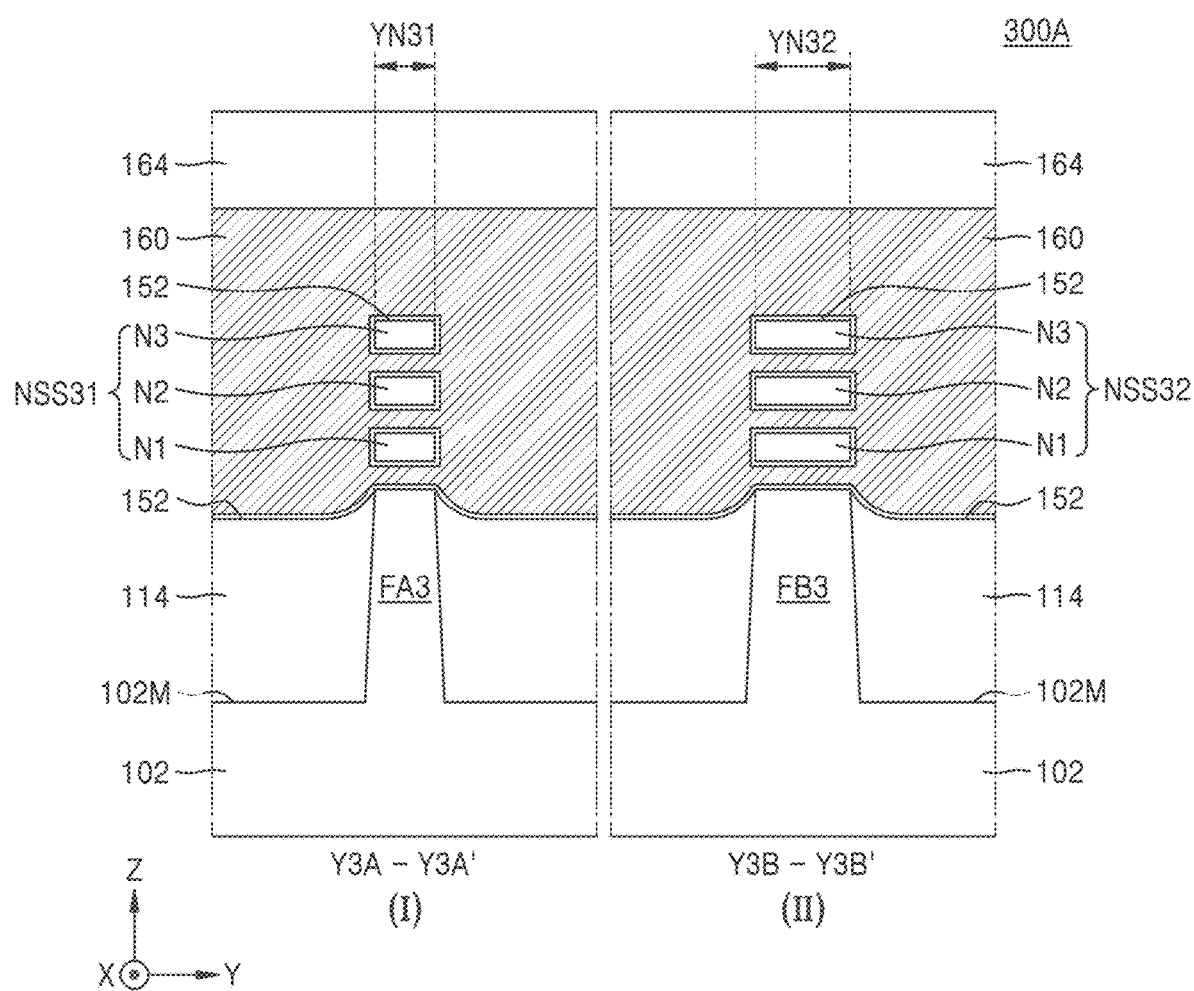
FIG. 10 shows cross-sectional views of cross-sectional configurations respectively taken along line Y3A-Y3A' of FIG. 9A and line Y3B-Y3B' of FIG. 9B.
Figure 11:
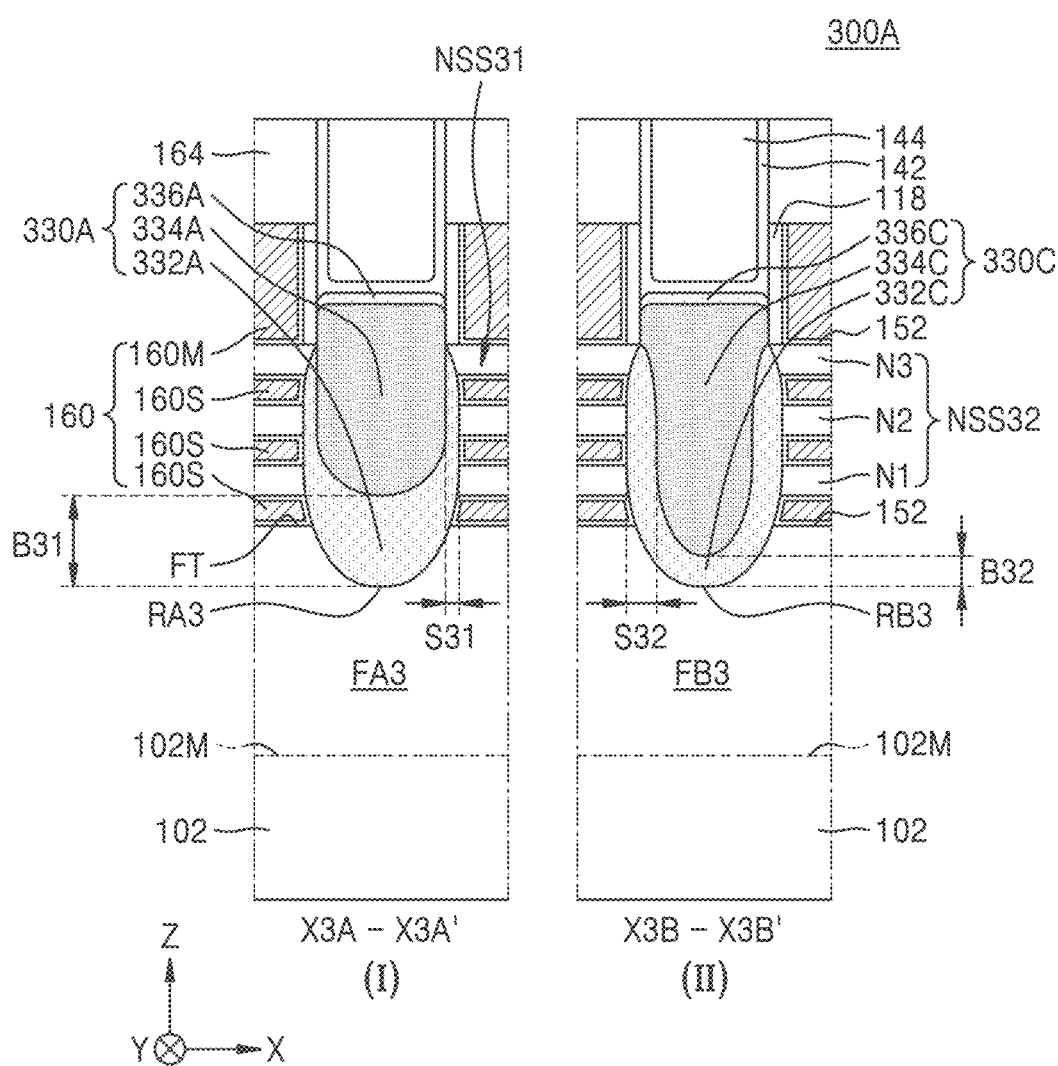
FIG. 11 shows cross-sectional views of cross-sectional configurations respectively taken along line X3A-X3A' of FIG. 9A and line X3B-X3B' of FIG. 9B.

FIGS. 9A and 9B are plan layout diagrams of an IC device 300A according to an example embodiment. FIGS. 9A and 9B illustrate cross-sectional configurations of the IC device 300A, according to some specific example embodiments of the IC device 200 shown in FIG. 4. FIG. 10 shows cross-sectional views of cross-sectional configurations respectively taken along line Y3A-Y3A' of FIG. 9A and line Y3B-Y3B' of FIG. 9B. FIG. 11 shows cross-sectional views of cross-sectional configurations respectively taken along line X3A-X3A' of FIG. 9A and line X3B-X3B' of FIG. 9B.

Referring to FIGS. 9A, 9B, 10, and 11, the IC device 300A may constitute a logic device. A first PMOS transistor region PA31 may be in a first region I of the IC device 300A, and a second PMOS transistor region PA32 may be in a second region II of the IC device 300A. In the IC device 300A, each of the first PMOS transistor region PA31 of the first region I and the second PMOS transistor region PA32 of the second region II may include a structure having the same structure as that described with reference to FIGS. 1 and 2A to 2C. However, a fin-type active region FA3 and a first nanosheet stack NSS31 may be in the first region I. The first nanosheet stack NSS31 may be on the fin-type active region FA3 and have a first width YN31 in a second lateral direction (Y direction). A broad fin-type active region FB3 having a greater width than the fin-type active region FA3 may be in the second region II. In the second region II, a second nanosheet stack NSS32 may be on the broad fin-type active region FB3. The second nanosheet stack NSS32 may have a second width YN32, which is greater than the first width YN31 in the second lateral direction (Y direction). As used herein, the second nanosheet stack NSS32 may be referred to as a broad nanosheet stack. In addition, each of a first nanosheet N1, a second nanosheet N2, and a third nanosheet N3 in the second nanosheet stack NSS32 may be referred to as a broad nanosheet. In some example embodiments, the first width YN31 may be selected in a range of about 5 nm to about 25 nm, and the second width YN32 may be selected in a range of about 26 nm to about 45 nm, but the inventive concepts are not limited thereto.

Detailed configurations of the fin-type active region FA3 and the broad fin-type active region FB3 may be substantially the same as those of the fin-type active region FA, which have been described with reference to FIGS. 1 and 2A to 2C. A detailed configuration of each of the first nanosheet stack NSS31 and the second nanosheet stack NSS32 may be substantially the same as that of the nanosheet stack NSS, which has been described with reference to FIGS. 2A and 2B.

Referring to FIGS. 9A, 10, and 11, a plurality of gate structures 160 may be on the fin-type active region FA3 in the first region I. As shown in FIG. 9A, a plurality of first source/drain regions 330A having substantially the same width in the second lateral direction (Y direction) may be on the fin-type active region FA3. A detailed configuration of the first source/drain region 330A may be substantially the same as that of the first source/drain region 130A, which has been described with reference to FIGS. 1, 2A, and 2B.

As shown in FIG. 11, a first recess RA3 may be formed adjacent to the gate structure 160 in the fin-type active region FA3 in the first region I. The first recess RA3 may be filled with the first source/drain region (see 330A in FIGS. 9A and 11).

As shown in FIGS. 9B, 10, and 11, a plurality of gate structures 160 may be on the broad fin-type active region FB3 in the second region II. As shown in FIG. 9B, third source/drain regions 330C having different widths from each other in the second lateral direction (Y direction) may be on the broad fin-type active region FB3. A detailed configuration of the third source/drain region 330C may be substantially the same as that of the first source/drain region 130A, which has been described with reference to FIGS. 1, 2A, and 2B.

As shown in FIG. 11, a second recess RB3 may be formed adjacent to the gate structure 160 on the broad fin-type active region FB3 in the second region II. The second recess RB3 may be filled with the third source/drain region (see 330C in FIGS. 9B and 11).

As shown in FIG. 11, the first source/drain region 330A in the first region I may include a lower main body layer 332A, an upper main body layer 334A, and a capping layer 336A, which are sequentially stacked in a direction away from the fin-type active region FA3 in a vertical direction (Z direction). Detailed configurations of the lower main body layer 332A, the upper main body layer 334A, and the capping layer 336A may be substantially the same as the lower main body layer 232B, the upper main body layer 234B, and the capping layer 236B, which have been described with reference to FIG. 7.

As shown in FIG. 11, the third source/drain region 330C in the second region II may include a lower main body layer 332C, an upper main body layer 334C, and a capping layer 336C, which are sequentially stacked in a direction away from the broad fin-type active region FB3 in the vertical direction (Z direction). Detailed configurations of the lower main body layer 332C, the upper main body layer 334C, and the capping layer 336C may be substantially the same as those of the lower main body layer 232D, the upper main body layer 234D, and the capping layer 236D, which have been described with reference to FIG. 7.

In the IC device 300A, a thickness S32 of a side portion (e.g., a side sub-portion of a surrounding portion) of the lower main body layer 332C, which is in the third source/drain region 330C in the second region II and adjacent to the second nanosheet stack NSS32, may be greater than a thickness S31 of a side portion (e.g., a side sub-portion of surrounding portion) of the lower main body layer 332A, which is in the first source/drain region 330A in the first region I and adjacent to the first nanosheet stack NSS31. In the IC device 300A, a thickness B32 of a bottom portion (e.g., a bottom sub-portion of the surrounding portion) of the lower main body layer 332C, which is in the third source/drain region 330C in the second region II and in contact with the broad fin-type active region FB3, may be less than a thickness B21 of a bottom portion (e.g., a bottom sub-portion of the surrounding portion) of the lower main body layer 332A, which is in the first source/drain region 330A in the first region I and in contact with the fin-type active region FA3.

Referring to FIGS. 9A, 9B, 10, and 11, in the IC device 200A, similar to the IC device 200A described with reference to FIGS. 5A, 5B, 6, and 7, the occurrence of a leakage current flowing through the fin-type active region FA3 may be inhibited or mitigated in a PMOS transistor including the first source/drain region 330A in the first region I, and the performance of a PMOS transistor including the first nanosheet stack NSS31 having the first width YN31, which is a relatively small width, in the second lateral direction (Y direction) may be improved. In addition, a structure capable of ensuring different electrical properties required by PMOS transistors respectively in the first region I and the second region II may be provided.

Figure 12:
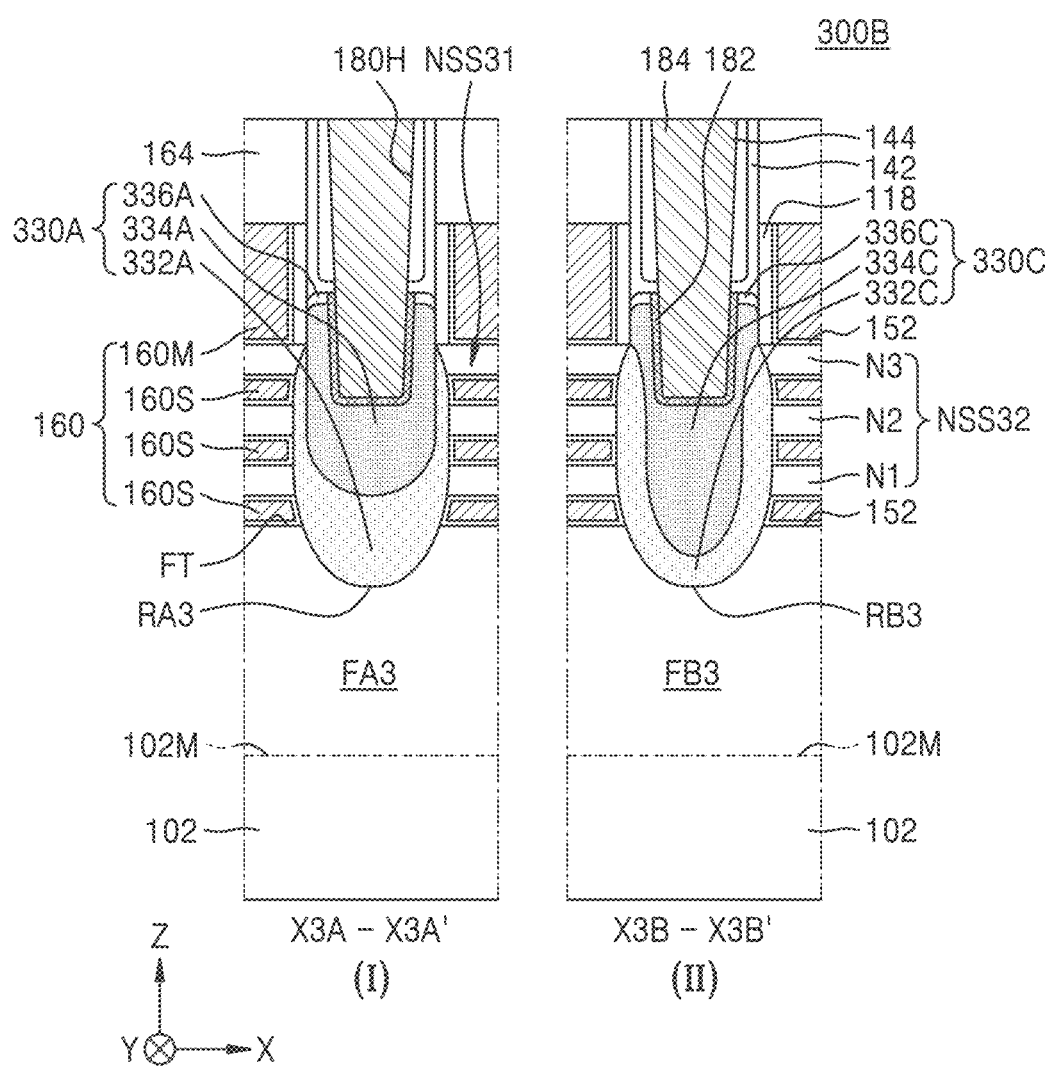
FIG. 12 is a cross-sectional view of an IC device according to an example embodiment.

FIG. 12 is a cross-sectional view of an IC device 300B according to an example embodiment. FIG. 12 illustrates some cross-sectional components in portions corresponding to cross-sections taken along line X3A-X3A' of FIG. 9A and X3B-X3B' of FIG. 9B. In FIG. 12, the same reference numerals are used to denote the same elements as in FIGS. 1, 2A to 2C, and 11, and detailed descriptions thereof are omitted.

Referring to FIG. 12, the IC device 300B may have substantially the same configuration as the IC device 300A described with reference to FIGS. 9A, 9B, 10, and 11. However, the IC device 300B may further include a plurality of source/drain contacts 184, which are on a first source/drain region 330A in a first region II and a third source/drain region 330C in a second region II. A metal silicide film 182 may be between the first and third source/drain regions 330A and 330C and the source/drain contact 184. Detailed configurations of the source/drain contact 184 and the metal silicide film 182 may be the same as those described with reference to FIG. 3.

Figure 13:
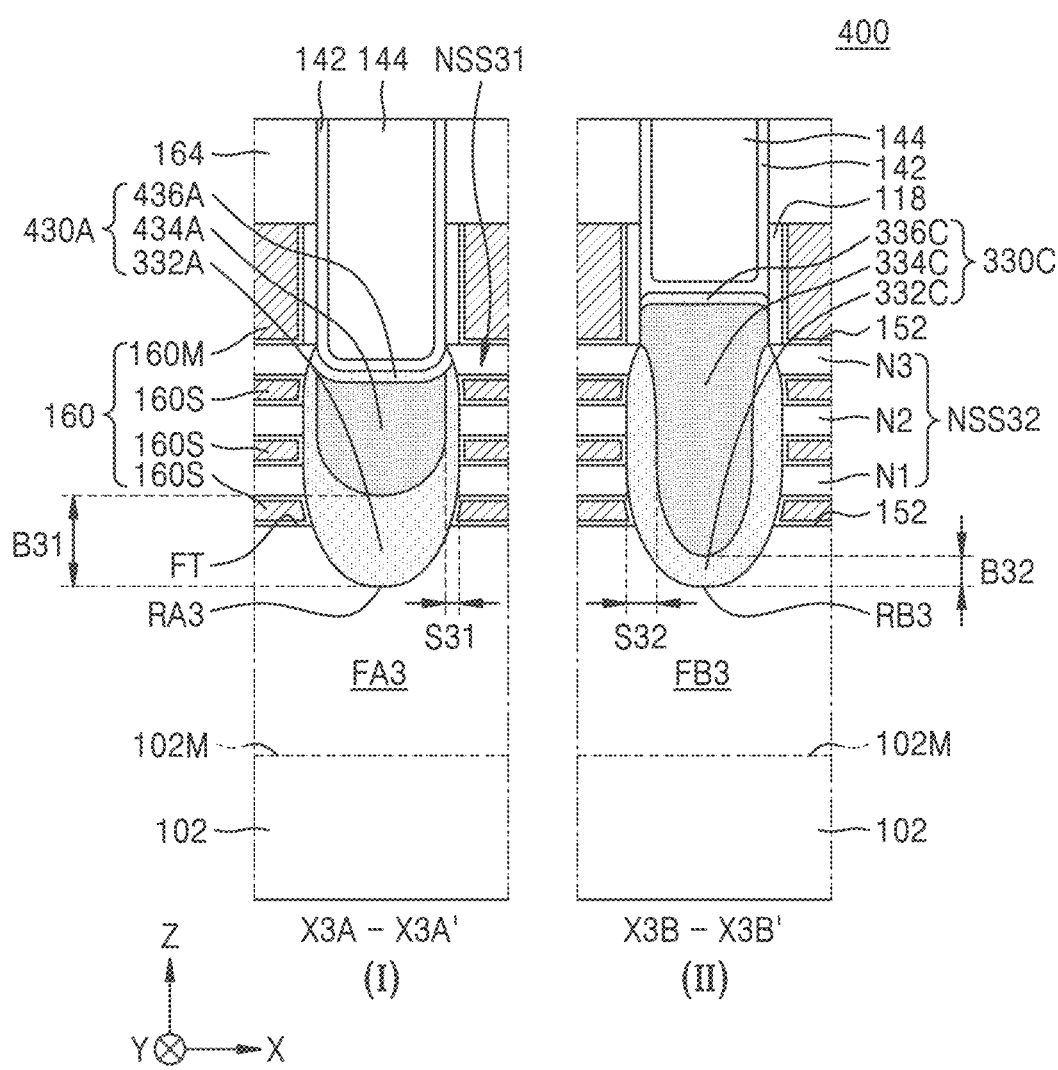
FIG. 13 is a cross-sectional view of an IC device according to an example embodiment.

FIG. 13 is a cross-sectional view of an IC device 400 according to an example embodiment. FIG. 13 illustrates some cross-sectional components in portions corresponding to cross-sections taken along line X3A-X3A' of FIG. 9A and X3B-X3B' of FIG. 9B.

Referring to FIG. 13, the IC device 400 may have substantially the same configuration as the IC device 300A described with reference to FIGS. 9A, 9B, 10, and 11. However, the IC device 400 may include a first source/drain region 430A filling a first recess RA3 in a first region I. The first source/drain region 430A may have substantially the same configuration as the first source/drain region 330A described with reference to FIG. 11. However, a top surface of the first source/drain region 430A may be at a vertical level lower than a fin top surface FT of a fin-type active region FA3.

The first source/drain region 430A in the first region I may include a lower main body layer 332A, an upper main body layer 434A, and a capping layer 436A, which are sequentially stacked in a direction away from the fin-type active region FA3 in a vertical direction (Z direction). Detailed configurations of the lower main body layer 332A, the upper main body layer 434A, and the capping layer 436A may be substantially the same as those of the lower main body layer 232B, the upper main body layer 234B, and the capping layer 236B, which have been described with reference to FIG. 7. However, each of the upper main body layer 434A and the capping layer 436A may have a concave top surface upward.

Figure 14:
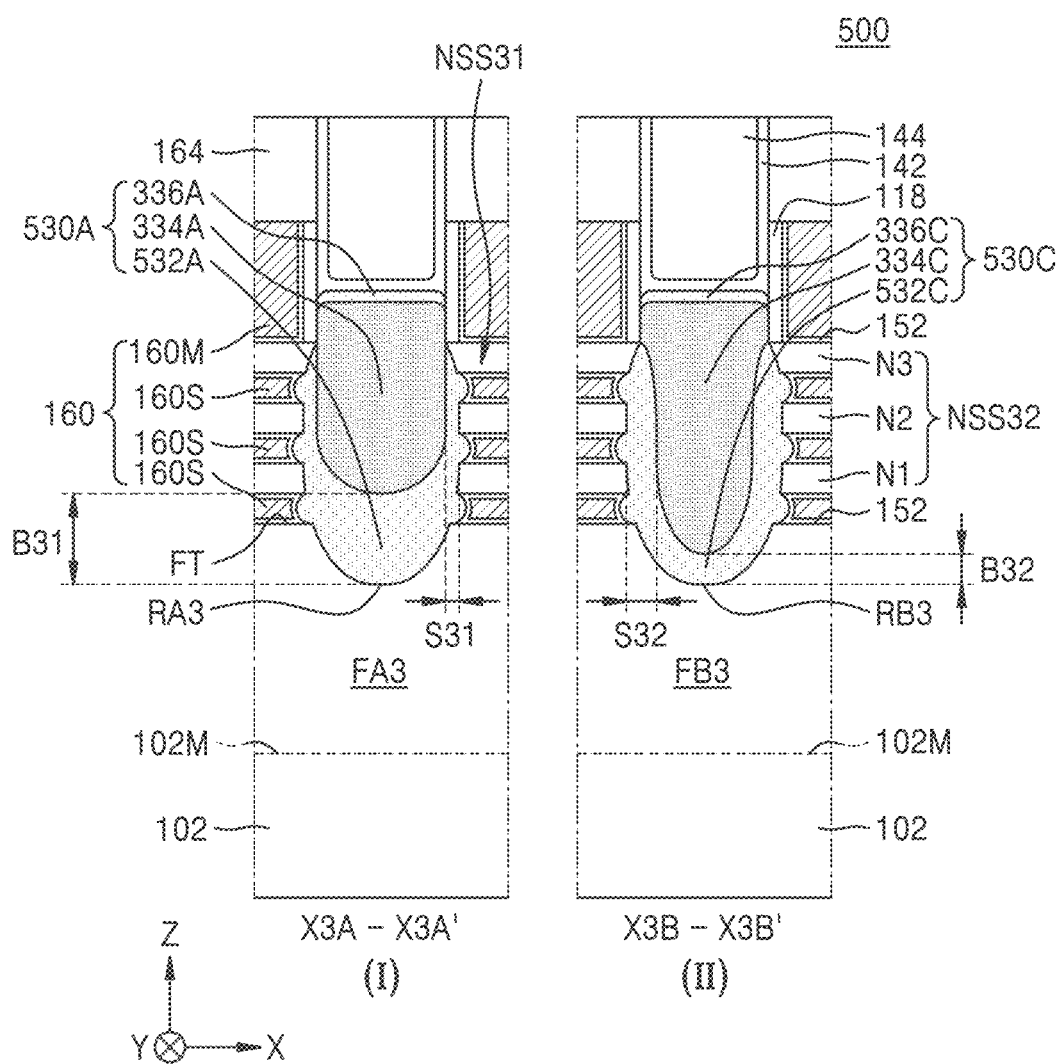
FIG. 14 is a cross-sectional view of an IC device according to an example embodiment.

FIG. 14 is a cross-sectional view of an IC device 500 according to an example embodiment. FIG. 14 illustrates some cross-sectional components in portions corresponding to cross-sections taken along line X3A-X3A' of FIG. 9A and X3B-X3B' of FIG. 9B.

Referring to FIG. 14, the IC device 500 may have substantially the same configuration as the IC device 300A described with reference to FIGS. 9A, 9B, 10, and 11. However, the IC device 500 may include a first source/drain region 530A and a third source/drain region 530C. The first source/drain region 530A fills a first recess RA3 in a first region I, and the third source/drain region 530C may fill a second recess RB3 in a second region II. The first source/drain region 530A and the third source/drain region 530C may respectively and substantially the same configurations as the first source/drain region 330A and the third source/drain region 330C, which are described with reference to FIG. 11. However, the first source/drain region 530A may include a lower main body layer 532A having a plurality of protrusions protruding toward a plurality of sub-gate portions 160S in the first region I, and the third source/drain region 330C may have a lower main body layer 532C having a plurality of protrusions protruding toward the plurality of sub-gate portions 160S in the second region II.

FIGS. 15A to 23 are cross-sectional views of a process sequence of a method of manufacturing an IC device, according to an example embodiment. FIGS. 15A, 16A, 17A, 18A, 19A, and 20 to 23 are cross-sectional views of a portion corresponding to a cross-section taken along line X1-X1' of FIG. 1, according to a process sequence. FIGS. 15B, 16B, 17B, 18B, and 19B are cross-sectional views of portions corresponding to cross-sections taken along lines Y1-Y1' and Y2-Y2' of FIG. 1, according to a process sequence. An example method of manufacturing the IC device 100 shown in FIGS. 1 and 2A to 2D will now be described with reference to FIGS. 15A to 23. In FIGS. 15A to 23, the same reference numerals are used to denote the same elements as in FIGS. 1 and 2A to 2C, and detailed descriptions thereof are omitted.

Figure 15A:
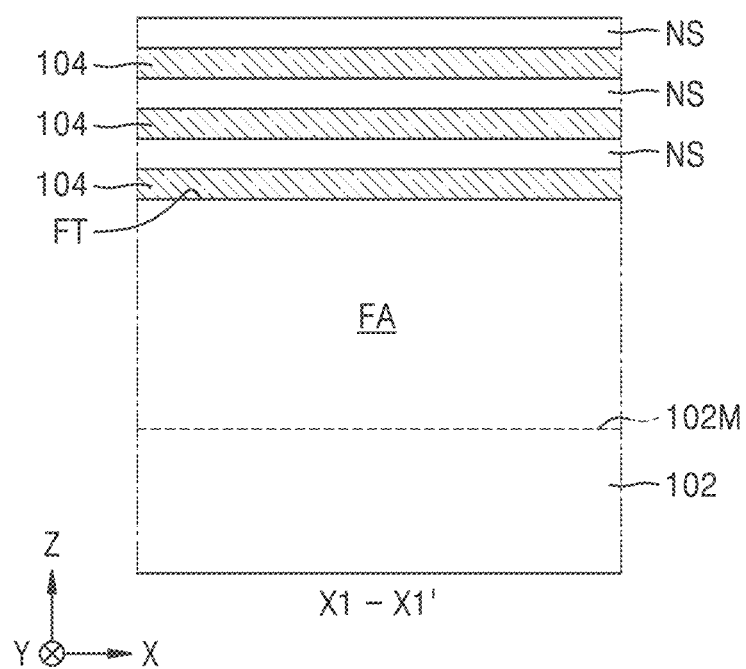
Figure 15B:
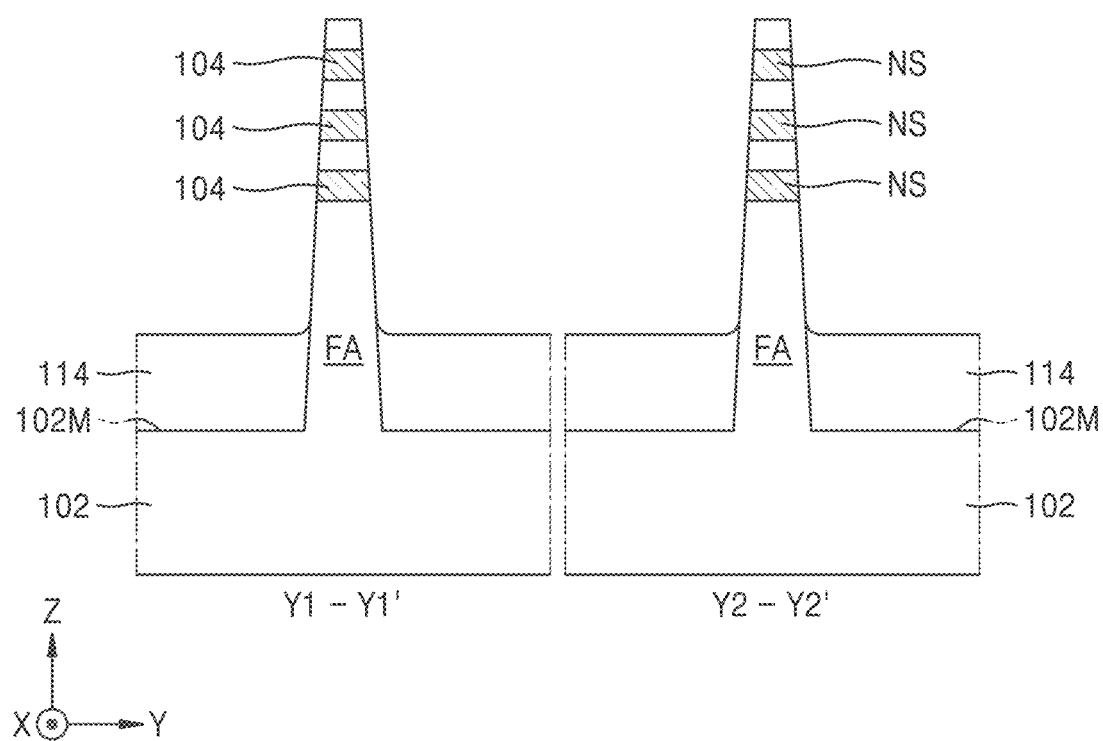
FIGS. 15B, 16B, 17B, 18B, and 19B are cross-sectional views of portions corresponding to cross-sections taken along lines Y1-Y1' and Y2-Y2' of FIG. 1, according to a process sequence.

Referring to FIGS. 15A and 15B, a plurality of sacrificial semiconductor layers 104 and a plurality of nanosheet semiconductor layers NS may be alternately stacked one by one on a substrate 102. Portions of the plurality of sacrificial semiconductor layers 104, the plurality of nanosheet semiconductor layers NS, and the substrate 102 may be etched to define a plurality of fin-type active regions FA in the substrate 102. Thereafter, a device isolation film 114 may be formed to cover sidewalls of each of the plurality of fin-type active regions FA. A stack structure of the plurality of sacrificial semiconductor layers 104 and the plurality of nanosheet semiconductor layers NS may be on a fin top surface FT of each of the plurality of fin-type active regions FA.

The plurality of sacrificial semiconductor layers 104 and the plurality of nanosheet semiconductor layers NS may include semiconductor materials having different etch selectivities from each other. In some example embodiments, the plurality of nanosheet semiconductor layers NS may include a Si layer, and the plurality of sacrificial semiconductor layers 104 may include a SiGe layer. In some example embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge content of the SiGe layer included in the plurality of sacrificial semiconductor layers 104 may be variously selected as needed.

Figure 16A:
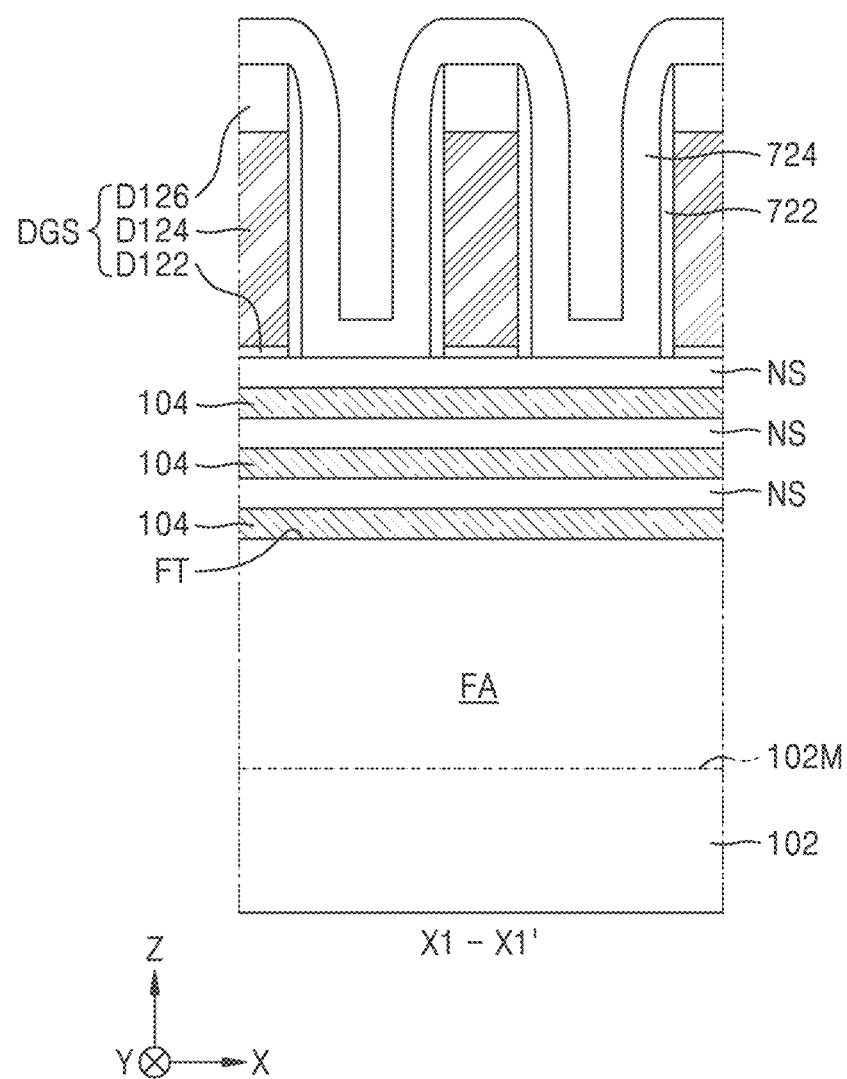
Figure 16B:
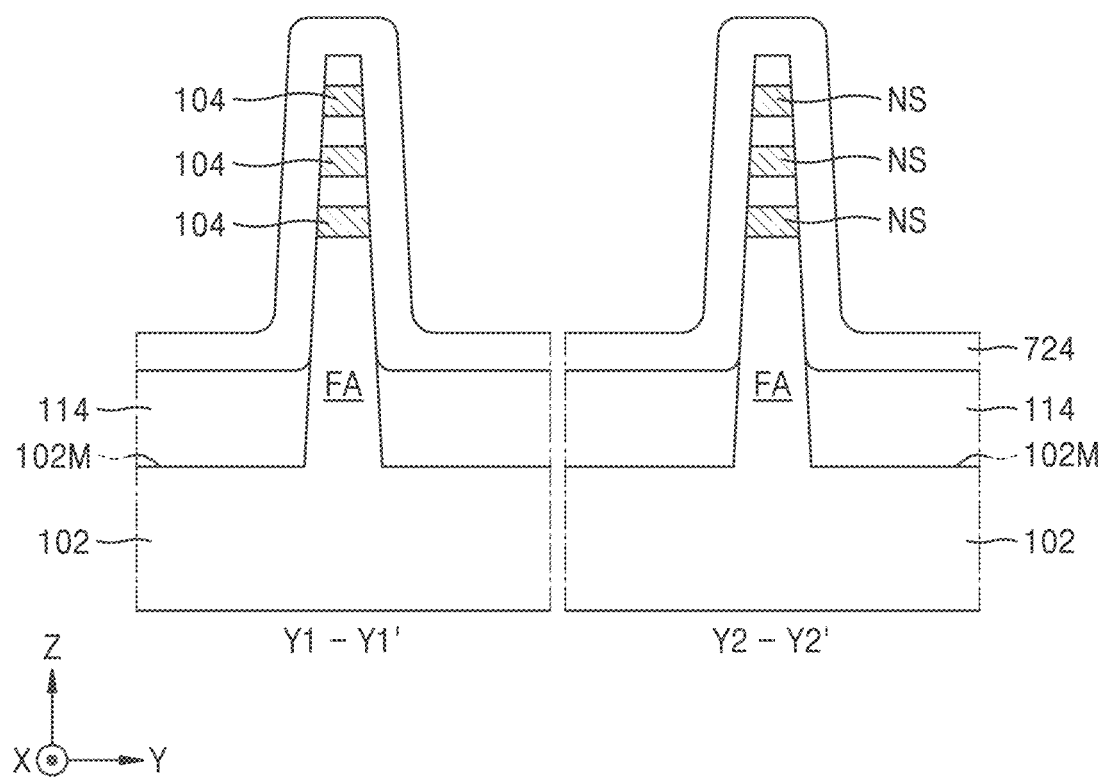

Referring to FIGS. 16A and 16B, a plurality of dummy gate structures DGS may be formed on the stack structure of the plurality of sacrificial semiconductor layers 104 and the plurality of nanosheet semiconductor layers NS. Each of the plurality of dummy gate structures DGS may be formed to extend long in a second lateral direction (Y direction). Each of the plurality of dummy gate structures DGS may have a structure in which an oxide film D122, a dummy gate layer D124, and a capping layer D126 are sequentially stacked. In some example embodiments, the dummy gate layer D124 may include polysilicon, and the capping layer D126 may include a silicon nitride film.

Thereafter, inner gate insulating spacers 722 may be formed to cover both sidewalls of the dummy gate structure DGS. Thereafter, a spacer film 724 may be formed to cover the fin-type active region FA, the dummy gate structure DGS, and the inner gate insulating spacers 722. The inner gate insulating spacer 722 may include SiN. The spacer film 724 may include SiOCN, SiCN, or a combination thereof. In some example embodiments, the spacer film 724 may include a single film including SiOCN. In other example embodiments, the spacer film 724 may include a SiOCN film covering the inner gate insulating spacer 722 and an oxide film covering the SiOCN film.

Figure 17A:
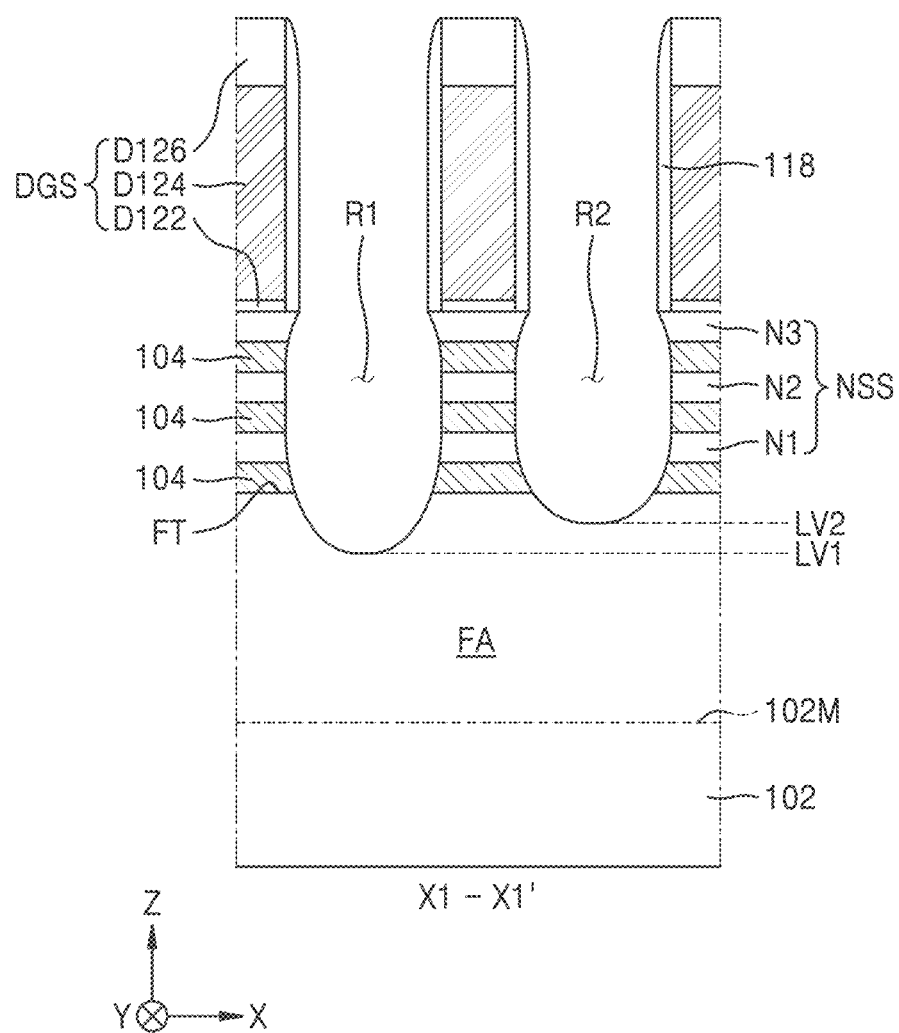
Figure 17B:
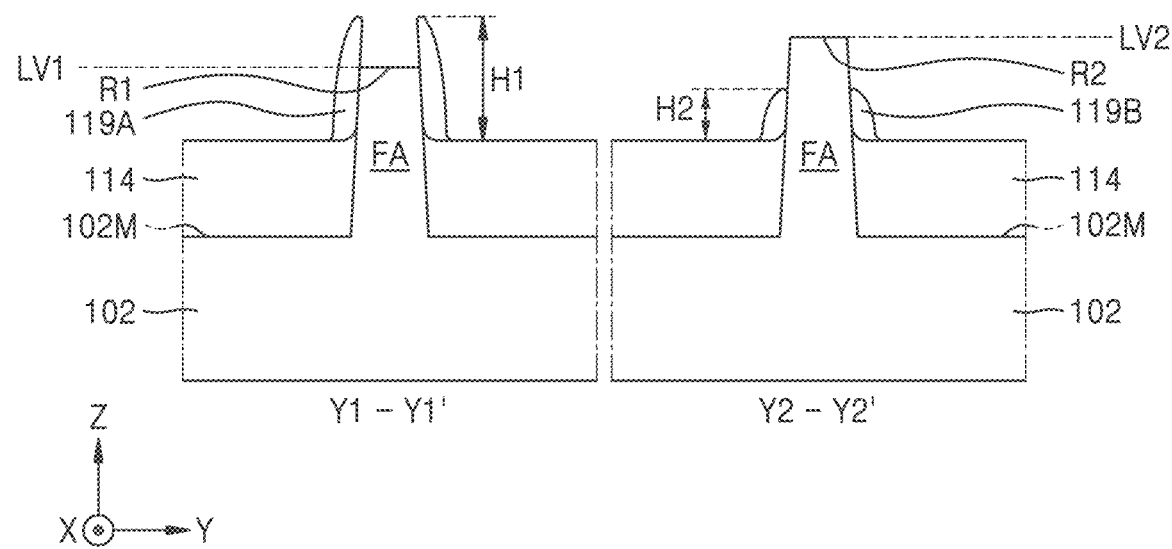

Referring to FIGS. 17A and 17B, while the NMOS transistor region (refer NA in FIG. 1) is being covered with a mask pattern (not shown), the spacer film 724 may be partially etched in the PMOS transistor region PA, and thus, outer insulating spacers 118 covering both sidewalls of the dummy gate structure DGS may be formed from the inner gate insulating spacer 722 and the spacer film 724. During the formation of the outer insulating spacers 118, the spacer film 724 may be etched to expose the fin-type active region FA. The fin-type active region FA, which is exposed, may be etched together with the spacer film 724, and thus, a first recess R1 and a second recess R2 may be formed in the fin-type active region FA. To form the first recess R1 and the second recess R2, an etching process using a dry etching process, a wet etching process, or a combination thereof may be performed.

During the formation of the outer insulating spacers 118, the spacer film 724 may be etched to expose the fin-type active region FA. The fin-type active region FA, which is exposed, may be etched together with the spacer film 724, and thus, the first recess R1 and the second recess R2 may be formed in the fin-type active region FA. In this case, an etching gas for forming the second recess R2 may be diffused through the separation region AP into portions of the fin-type active region FA, which are adjacent to the separation region (see AP in FIG. 1) in the second lateral direction (Y direction). Thus, the etch gas may be supplied in a smaller amount into a region in which the second recess R2 will be formed, than other portions. In contrast, in a region of the fin-type active region FA, which is apart from the separation region AP in the second lateral direction (Y direction) and where the first recess R1 will be formed, the etch gas may be diffused in a relatively small amount into other surrounding regions, due to the stack structure of the plurality of sacrificial semiconductor layers 104 and the plurality of nanosheet semiconductor layers NS, which are adjacent to the region. As described above, there may be a difference in the distribution of the etch gas between the region where the first recess R1 will be formed and the region where the second recess R2 will be formed. As a result, a first vertical level LV1 of a bottom portion of the first recess R1 may become lower than a second vertical level LV2 of a bottom portion of the second recess R2.

During the etching process for forming the first recess R1 and the second recess R2, first recess-side insulating spacers 119A covering both sidewalls of the fin-type active region FA may be formed in a region adjacent to the first recess R1, and second recess-side insulating spacers 119B covering both sidewalls of the fin-type active region FA may be formed in a region adjacent to the second recess R2. During the formation of the first recess R1 and the second recess R2, a first height H1 of the first recess-side insulating spacers 119A may be greater than a second height H2 of the second recess-side insulating spacers 119B in a vertical direction (Z direction) for a cause similar to the above-described difference in distribution of an etch gas relative to a distance from the separation region AP in the second lateral direction (Y direction).

Figure 18A:
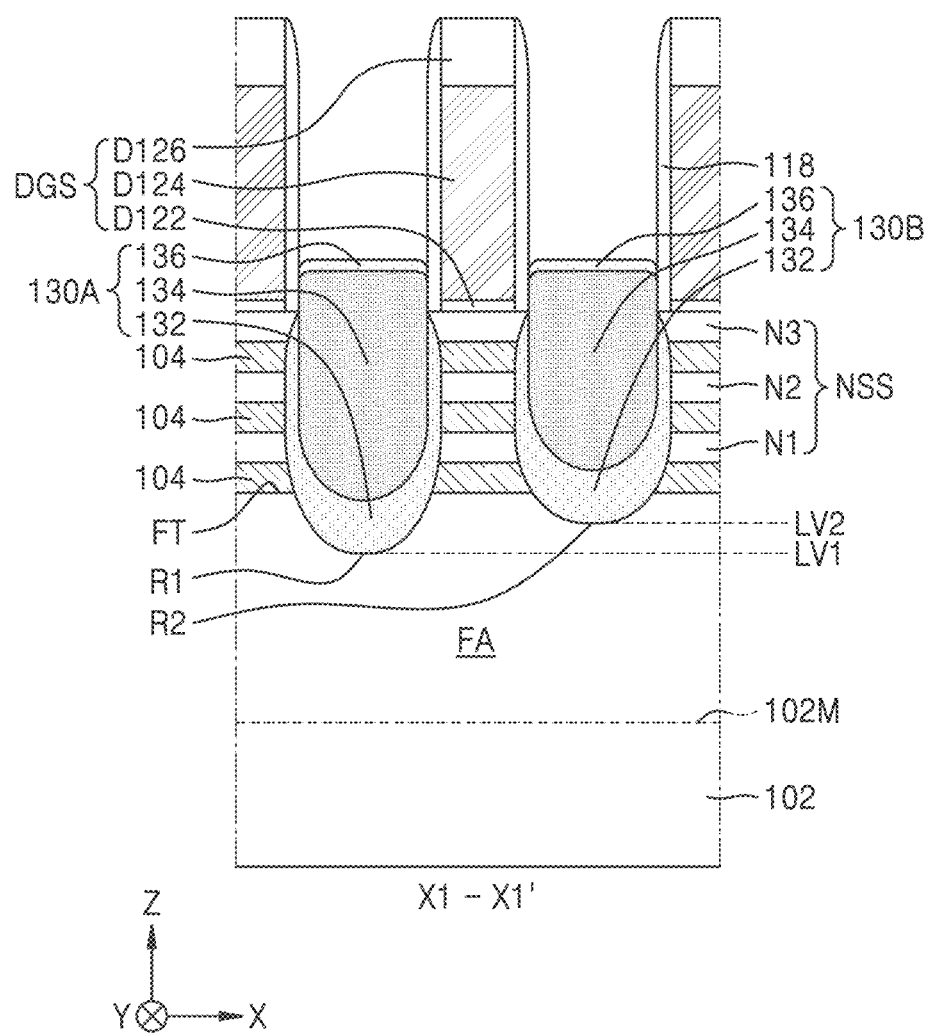
Figure 18B:
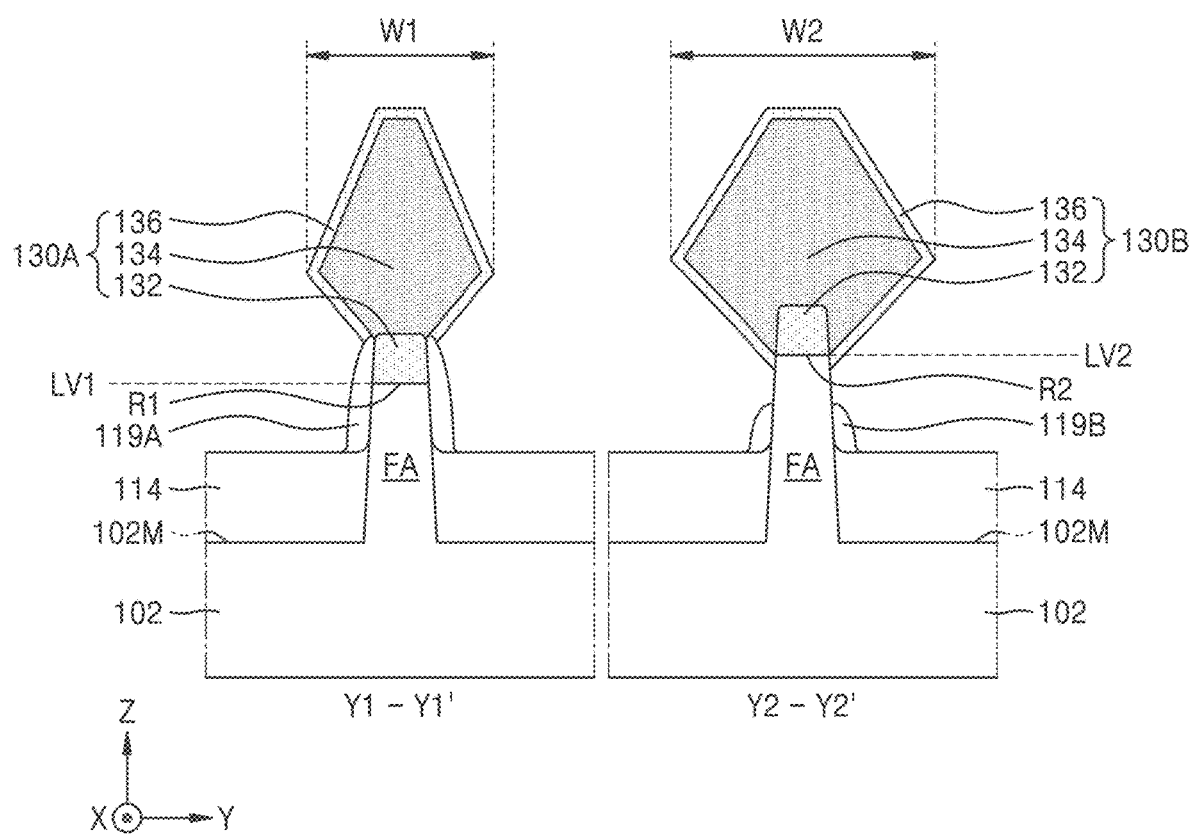

As shown in FIG. 18B, a bottom surface of the first recess R1 may be at a lower vertical level than a top portion of the first recess-side insulating spacer 119A. A bottom surface of the second recess R2 may be at a higher vertical level than a top portion of the second recess-side insulating spacer 119B. Accordingly, under the second recess R2, the fin-type active region FA may protrude over the second recess-side insulating spacers 119B in the vertical direction (Z direction).

To form the first recess R1, the second recess R2, the outer insulating spacers 118, the first recess-side insulating spacers 119A, and the second recess-side insulating spacers 119B by performing the processes described with reference to FIGS. 17A and 17B, a dry etching process and a wet cleaning process may be performed on the resultant structure of FIGS. 17A and 17B. In some example embodiments, a portion of the spacer film 724, a portion of the stack structure of the plurality of sacrificial semiconductor layers 104 and the plurality of nanosheet semiconductor layers NS, and a portion of the fin-type active region FA may be removed by using a dry etching process. In an example of performing the dry etching process, a plasma etching process may be performed by using $NH_3$, $CF_4$, or a combination thereof as an etch gas. In an example of performing the wet cleaning process, a hydrofluoric acid (HF) cleaning solution may be used. However, the inventive concepts are not limited thereto, and various modifications and changes may be made within the scope thereof.

After the first recess R1 and the second recess R2 are formed in the fin-type active region FA, the plurality of nanosheet semiconductor layers (see NS in FIGS. 16A and 16B) may be divided into a plurality of nanosheet stacks NSS. Each of the plurality of nanosheet stacks NSS may include a first nanosheet N1, a second nanosheet N2, and a third nanosheet N3.

Referring to FIGS. 18A and 18B, in the resultant structure of FIGS. 17A and 17B, a first source/drain region 130A and a second source/drain region 130B may be formed on the fin-type active region FA, which is exposed on both sides of each of the plurality of nanosheet stacks NSS. To form the first source/drain region 130A and the second source/drain region 130B, a lower main body layer 132), an upper main body layer 134, and a capping layer 136 may be sequentially formed inside each of the first recess R1 and the second recess R2.

In some example embodiments, to form the lower main body layer 132, a semiconductor material may be epitaxially grown from a surface of the fin-type active region FA exposed at a bottom surface of each of the first and second recesses R1 and R2, sidewalls of each of the first to third nanosheets N1, N2, and N3, and sidewalls of each of the plurality of sacrificial semiconductor layers 104. In some example embodiments, to form the lower main body layer 132, a low-pressure chemical vapor deposition (LPCVD) process, a selective epitaxial growth (SEG) process, or a cyclic deposition and etching (CDE) process may be performed by using source materials including an element semiconductor precursor. The element semiconductor precursor may include an element, such as silicon (Si) and germanium (Ge).

the lower main body layer 132 may include a SiGe layer. To form the lower main body layer 132, a Si source and a Ge source may be used. Silane ($SiH_4$), disilane ($Si_2H_6$), trisilane ($Si_3H_8$), and/or dichlorosilane ($SiH_2Cl_2$) may be used as the silicon source. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source, without being limited thereto. When the lower main body layer 132 includes a SiGe layer doped with boron (B), a B source may be further used in addition to the Si source and the Ge source to form the B-doped SiGe layer. Diborane ($B_2H_6$), triborane, tetraborane, and/or pentaborane may be used as the B source, without being limited thereto. In some example embodiments, during an epitaxial growth process for forming the lower main body layer 132, a B dopant ion implantation process using the B source may be performed in-situ.

To form the upper main body layer 134 on the lower main body layer 132, a process similar to the above-described process of forming the lower main body layer 132 may be performed. In some example embodiments, the process of forming the upper main body layer 134 may be performed in-situ with the process of forming the lower main body layer 132. To form the capping layer 136 on the upper main body layer 134, a process similar to the above-described process of forming the lower main body layer 132 may be performed. In some example embodiments, the process of forming the capping layer 136 may be performed in-situ with the processes of forming the lower main body layer 132 and the upper main body layer 134.

After the lower main body layer 132, the upper main body layer 134, and the capping layer 136 are formed to fill each of the first recess R1 and the second recess R2, a reflow process may be performed, and thus, a first source/drain region 130A and a second source/drain region 130B may be formed on the fin-type active region FA.

During the formation of the first source/drain region 130A and the second source/drain region 130B, the second recess-side insulating spacer 119B, the second recess-side insulating spacer 119B under the second recess R2 may have a relatively small height, and a portion of the fin-type active region FA may protrude over the second recess-side insulating spacer 119B. Accordingly, a lateral growth rate of the second source/drain region 130B may be higher than a lateral growth rate of the first source/drain region 130A. As a result, a greatest width W2 of the second source/drain region 130B may become greater than a greatest width W1 of the first source/drain region 130A in the second lateral direction (Y direction).

Figure 19A:
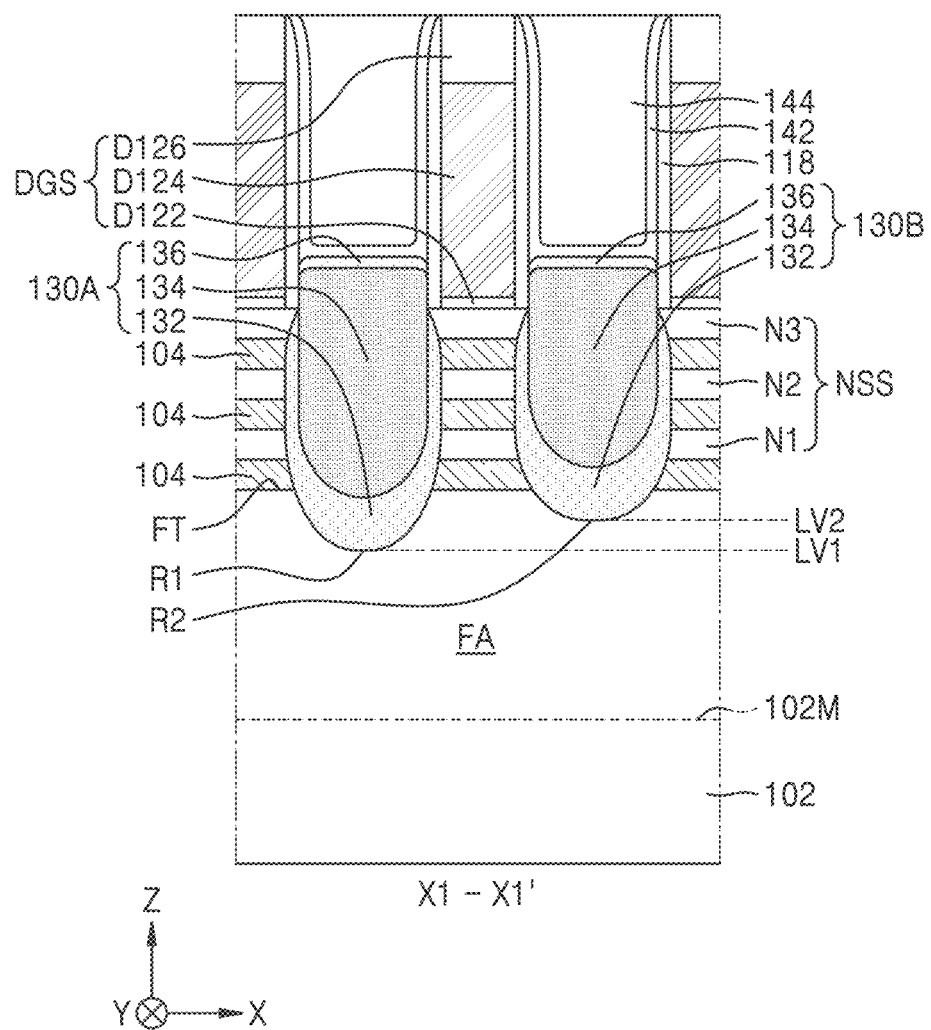
Figure 19B:
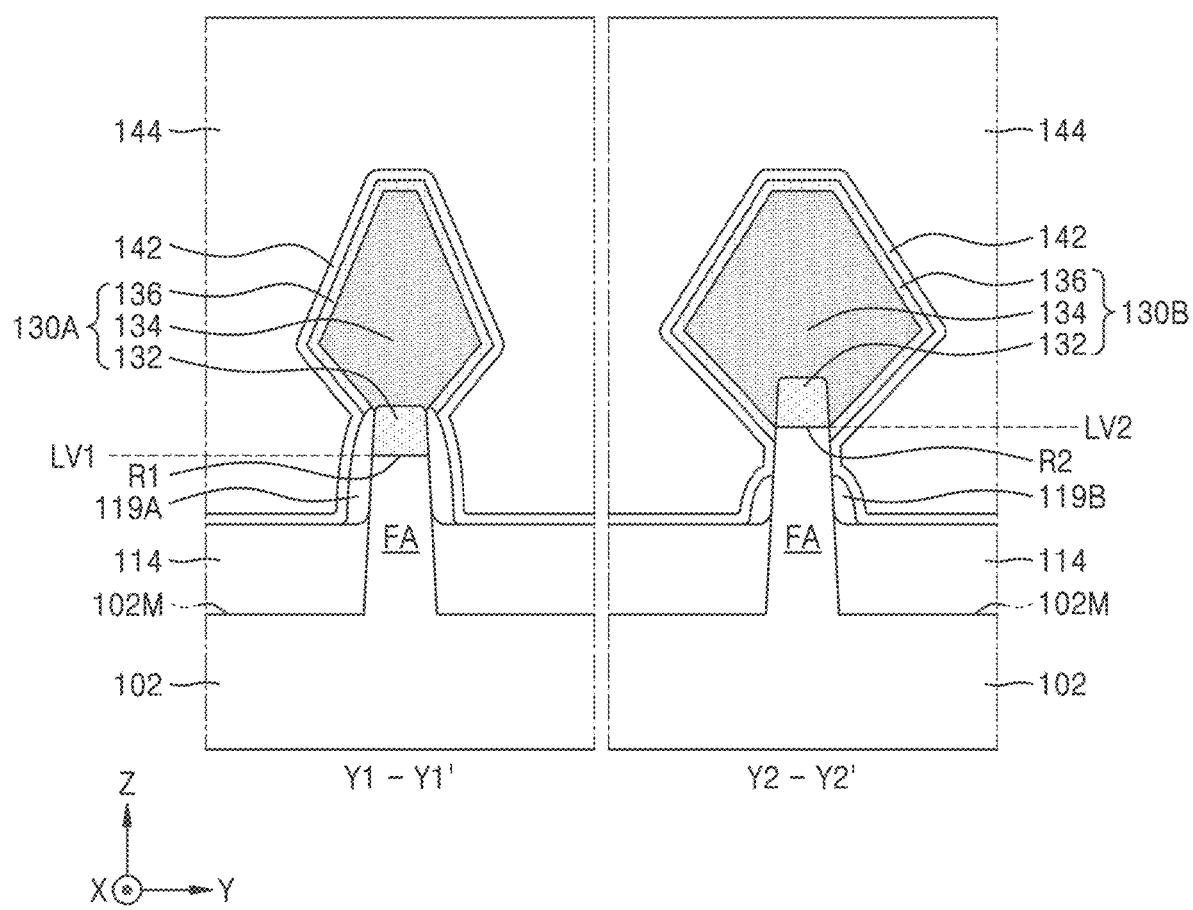

Referring to FIGS. 19A and 19B, an insulating liner 142 may be formed to cover the resultant structure of FIGS. 18A and 18B, and an inter-gate dielectric film 144 may be formed on the insulating liner 142. The insulating liner 142 and the inter-gate dielectric film 144 may be planarized to expose a top surface of the capping layer D126.

Figure 20:
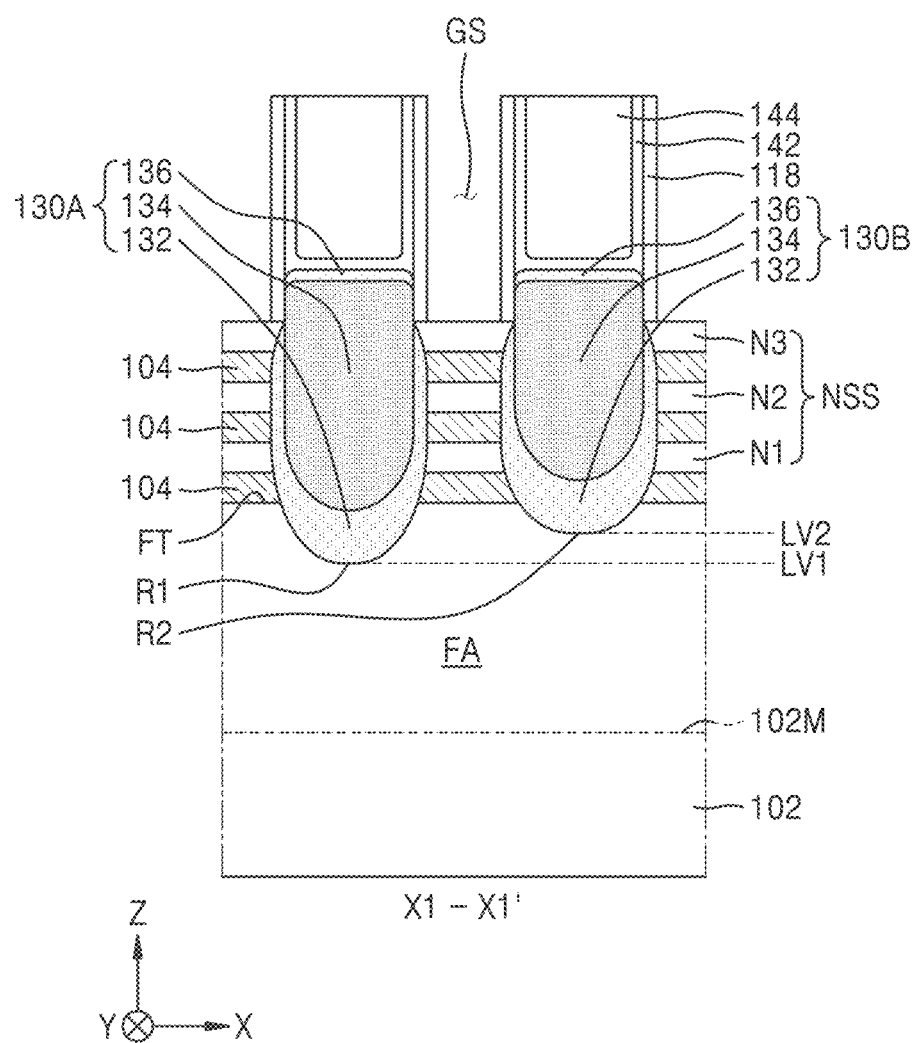

Referring to FIG. 20, the capping layer D126 may be removed from the resultant structure of FIGS. 19A and 19B to expose a top surface of the dummy gate layer D124. The insulating liner 142 and the inter-gate dielectric film 144 may be partially removed such that a top surface of the inter-gate dielectric film 144 becomes substantially at the same level as the top surface of the dummy gate layer D124.

Figure 21:
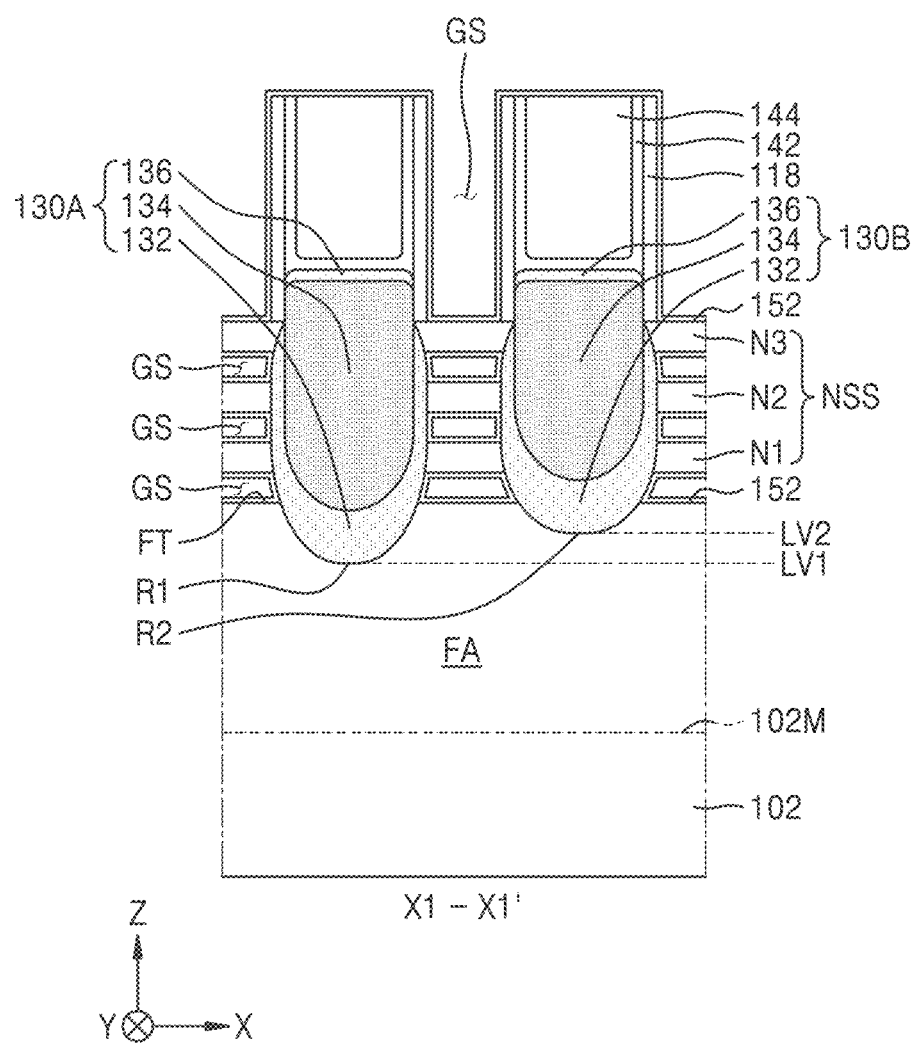

Referring to FIG. 21, the dummy gate layer D124 and the oxide film D122 located thereunder may be removed from the resultant structure of FIG. 20 to prepare a gate space GS, and the plurality of nanosheet stacks NSS may be exposed through the gate space GS. Thereafter, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region FA.

In some example embodiments, to selectively remove the plurality of sacrificial semiconductor layers 104, etch selectivities of the first to third nanosheets N1, N2, and N3 with respect to the plurality of sacrificial semiconductor layers 104 may be used. A liquid or gaseous etchant may be used to selectively remove the plurality of sacrificial semiconductor layers 104. In some example embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Thereafter, a gate dielectric film 152 may be formed to cover respective exposed surfaces of the first to third nanosheets N1, N2, and N3 and the fin-type active region FA. The gate dielectric film 152 may be formed using an atomic layer deposition (ALD) process.

Figure 22:
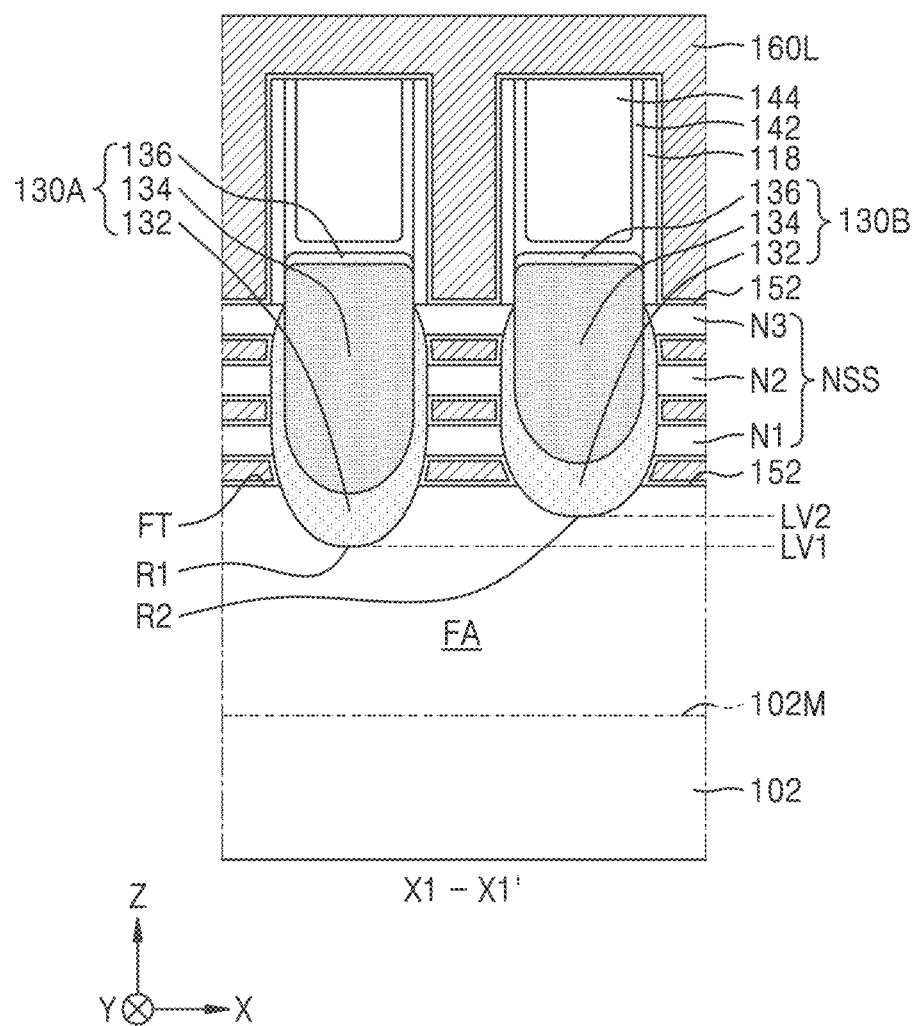

Referring to FIG. 22, a gate-forming conductive layer 160L filling the gate space (see GS in FIG. 21) and covering the top surface of the inter-gate dielectric film 144 may be formed on the gate dielectric film 152. The gate-forming conductive layer 160L may include a metal, a metal nitride, a metal carbide, or a combination thereof. The gate-forming conductive layer 160L may be formed using an ALD process or a CVD process.

Figure 23:
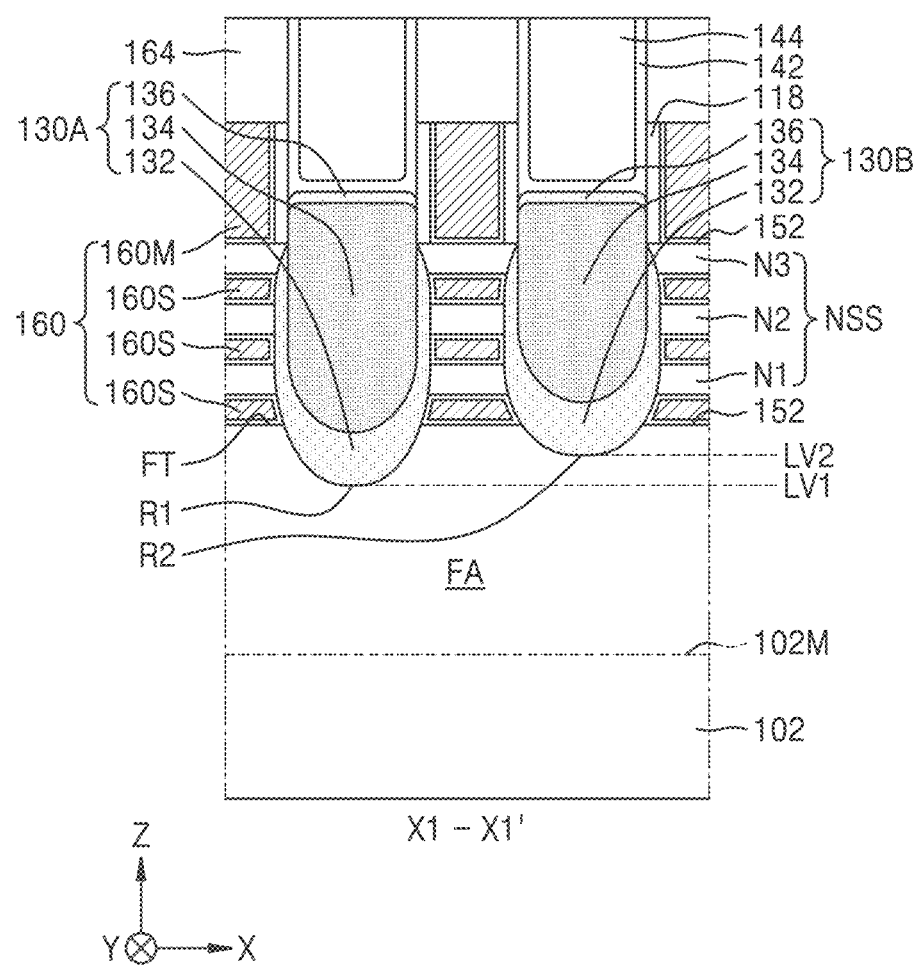

Referring to FIG. 23, in the resultant structure of FIG. 22, the gate-forming conductive layer 160L, the gate dielectric film 152, and the outer insulating spacers 118 may be partially removed from top surfaces thereof to expose the top surface of the inter-gate dielectric film 144 and empty an upper portion of the gate space GS again to form a gate structure 160. Thereafter, a capping insulating pattern 164 filling the gate space GS may be formed on the gate structure 160.

Although the method of manufacturing the IC device 100 shown in FIGS. 1 and 2A to 2C, according to the embodiment, have been described with reference to FIGS. 15A to 23, it will be understood that the IC devices 100A, 200, 200A, 200B, 300A, 300B, 400, and 500 shown in FIGS. 3 to 14 and IC devices having various structures may be manufactured by making various modifications and changes within the scope of the inventive concepts with reference to the descriptions provided with reference to FIGS. 15A to 23.

In some example embodiments, to manufacture the IC device 200A shown in FIGS. 5A, 5B, 6, and 7, processes similar to those described with reference to FIGS. 15A to 23 may be performed. However, in the process described with reference to FIGS. 18A and 18B, instead of forming the first source/drain region 130A and the second source/drain region 130B on the fin-type active region FA, a second source/drain region 230B having the configuration shown in FIG. 7 may be formed inside a first recess RA formed in the fin-type active region FA in the first region I, and a fourth source/drain region 230D may be formed in a second recess RB formed in a broad fin-type active region FB in the second region II. To form the second source/drain region 230B and the fourth source/drain region 230D, differences in epitaxial growth mechanism between the second source/drain region 230B and the fourth source/drain region 230D due to structural differences between a first nanosheet stack NSS1 and a second nanosheet stack NSS2 may be used. Specifically, the first nanosheet stack NSS1 may be adjacent to the first recess RA and have a first width YN1 in the second lateral direction (Y direction), and the second nanosheet stack NSS2 may be adjacent to the second recess RB in the second region II and has a second width YN2 in the second lateral direction (Y direction). Here, the second width YN2 may be greater than the first width YN1.

In an example embodiment, to manufacture the IC device 200A described with reference to FIGS. 9A, 9B, 10, and 11, processes similar to those of the above-described method of manufacturing the IC device 200A shown in FIGS. 5A, 5b, 6, and 7 may be performed.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:
   a plurality of fin-type active regions parallel to each other on a substrate, the plurality of fin-type active regions extending in a first lateral direction;
   a first nanosheet stack apart from a fin top surface of a first fin-type active region in a vertical direction, the first fin-type active region being selected from the plurality of fin-type active regions, the first nanosheet stack comprising at least one nanosheet facing the fin top surface of the first fin-type active region;
   a gate structure surrounding the first nanosheet stack on the first fin-type active region, the gate structure being elongated in a second lateral direction, wherein the second lateral direction is perpendicular to the first lateral direction;
   a first source/drain region in contact with one sidewall of the first nanosheet stack at a position adjacent to one side of the gate structure; and
   a second source/drain region in contact with another sidewall of the first nanosheet stack at a position adjacent to another side of the gate structure,
   wherein a greatest width of the first source/drain region is less than a greatest width of the second source/drain region in the second lateral direction.

2. The integrated circuit device of claim 1, wherein the first source/drain region has a first lowermost surface in contact with the first fin-type active region at a first vertical level between the fin top surface of the first fin-type active region and the substrate, and the second source/drain region has a second lowermost surface in contact with the first fin-type active region at a second vertical level, the second vertical level being closer to the fin top surface of the first fin-type active region than the first vertical level.

3. The integrated circuit device of claim 1, further comprising:
   a second fin-type active region selected from the plurality of fin-type active regions, the second fin-type active region being apart from the first fin-type active region with a separation region therebetween in the first lateral direction, the second fin-type active region and the first fin-type active region on a straight line, the second fin-type active region and the first fin-type active region each extending in the first lateral direction;

a third fin-type active region selected from the plurality of fin-type active regions, the third fin-type active region being apart from the first fin-type active region, the second fin-type active region, and the separation region in the second lateral direction;

a third source/drain region on the third fin-type active region, the third source/drain region being adjacent to the first source/drain region in the second lateral direction; and a fourth source/drain region on the third fin-type active region, the fourth source/drain region being adjacent to the separation region in the second lateral direction, wherein a greatest width of the third source/drain region is less than a greatest width of the fourth source/drain region in the second lateral direction, and each of the first source/drain region, the second source/drain region, the third source/drain region, and the fourth source/drain region constitutes a P-channel metal-oxide semiconductor (PMOS) transistor.

4. The integrated circuit device of claim 1, further comprising:

a device isolation film covering both sidewalls of a lower portion of each of the plurality of fin-type active regions;

first recess-side insulating spacers covering both sidewalls of a lower portion of the first fin-type active region between the device isolation film and the first source/drain region, the first recess-side insulating spacers being in contact with a lower portion of the first source/drain region; and second recess-side insulating spacers covering the both sidewalls of the lower portion of the first fin-type active region between the device isolation film and the second source/drain region, the second recess-side insulating spacers being apart from the second source/drain region, wherein a first height of each of the first recess-side insulating spacers is greater than a second height of each of the second recess-side insulating spacers in the vertical direction.

5. The integrated circuit device of claim 1, wherein each of the first source/drain region and the second source/drain region comprises a lower main body layer and an upper main body layer, which are sequentially stacked on the first fin-type active region in the vertical direction, the lower main body layer and the upper main body layer each comprising a $Si_{1-x}Ge_x$ layer (here, $0.0<x\leq0.6$), and the lower main body layer has a first germanium (Ge) content, and the upper main body layer has a Ge content higher than the first Ge content.

6. The integrated circuit device of claim 1, further comprising:

a fifth fin-type active region selected from the plurality of fin-type active regions, the fifth fin-type active region being apart from the first fin-type active region in the second lateral direction, the fifth fin-type active region having a greater length than the first fin-type active region in the first lateral direction;

a fifth source/drain region on the fifth fin-type active region, the fifth source/drain region being apart from the second source/drain region with a separation region therebetween in the second lateral direction, the fifth source/drain region and the second source/drain region being on a straight line, the fifth source/drain region and the second source/drain region each extending in the second lateral direction;

a sixth fin-type active region selected from the plurality of fin-type active regions, the sixth fin-type active region being apart from the first fin-type active region in the second lateral direction, the fifth fin-type active region and the sixth fin-type active region being opposite to each other with reference to the first fin-type active region, the sixth fin-type active region having a greater length than the first fin-type active region in the first lateral direction; and a sixth source/drain region on the sixth fin-type active region, the sixth source/drain region, the second source/drain region, and the fifth source/drain region being on a straight line, and the sixth source/drain region, the second source/drain region, and the fifth source/drain region each extending in the second lateral direction wherein a shortest distance between the second source/drain region and the fifth source/drain region is greater than a shortest distance between the second source/drain region and the sixth source/drain region in the second lateral direction.

7. The integrated circuit device of claim 1, further comprising:

a broad fin-type active region apart from the first fin-type active region, the broad fin-type active region having a greater width than the first fin-type active region;

a broad nanosheet stack comprising at least one nanosheet that is apart from a fin top surface of the broad fin-type active region in the vertical direction; and a third source/drain region in contact with one sidewall of the broad nanosheet stack, wherein each of the first source/drain region, the second source/drain region, and the third source/drain region comprises a lower main body layer and an upper main body layer, the lower main body layer comprising a first silicon germanium (SiGe) layer having a first Ge content, the upper main body layer comprising a second SiGe layer having a Ge content that is higher than the first Ge content, the lower main body layer of the third source/drain region adjacent to the broad nanosheet stack includes a core portion and a surrounding portion, the surrounding portion including a side sub-portion and a bottom sub-portion in contact with the broad fin-type active region, the lower main body layer of at least one of the first source/drain region and the second source/drain region that is adjacent to the first nanosheet stack includes a core portion and a surrounding portion, the surrounding portion including a side sub-portion and a bottom sub-portion in contact with the first fin-type active region, a thickness of the side sub-portion of the lower main body layer of the third source/drain region is greater than a thickness of the side sub-portion of the lower main body layer of at least one of the first source/drain region and the second source/drain region, and a thickness of the bottom sub-portion of the lower main body layer of the third source/drain region is less than a thickness of the bottom sub-portion of the lower main body layer of at least one of the first source/drain region and the second source/drain region.

8. An integrated circuit device comprising:

a first fin-type active region and a second fin-type active region being on a straight line, the first fin-type active region and the second fin-type active region each extending in a first lateral direction on a substrate, the first fin-type active region and the second fin-type active region apart from each other in the first lateral direction with a separation region therebetween;

a third fin-type active region apart from the first fin-type active region, the second fin-type active region, and the separation region in a second lateral direction, the third fin-type active region being elongated in the first lateral direction, the second lateral direction being perpendicular to the first lateral direction;

a plurality of nanosheet stacks on each of the first fin-type active region, the second fin-type active region, and the third fin-type active region, the plurality of nanosheet stacks each comprising at least one nanosheet;

a first source/drain region on the third fin-type active region, the first source/drain region being in contact with one sidewall of a first nanosheet stack on the third fin-type active region, from among the plurality of nanosheet stacks, the first source/drain region facing the first fin-type active region in the second lateral direction; and a second source/drain region on the third fin-type active region, the second source/drain region being in contact with another sidewall of the first nanosheet stack, the second source/drain region facing the separation region in the second lateral direction, wherein a greatest width of the first source/drain region is less than a greatest width of the second source/drain region in the second lateral direction.

9. The integrated circuit device of claim 8, wherein the first source/drain region has a first lowermost surface in contact with the third fin-type active region at a first vertical level between a fin top surface of the third fin-type active region and the substrate, and the second source/drain region has a second lowermost surface in contact with the third fin-type active region at a second vertical level, the second vertical level being higher than the first vertical level between the fin top surface of the third fin-type active region and the substrate.

10. The integrated circuit device of claim 8, wherein a source/drain region is not in the separation region.

11. The integrated circuit device of claim 8, wherein each of the first source/drain region and the second source/drain region comprises:

a lower main body layer comprising a $Si_{1-x}Ge_x$ layer (here, $0.0<x\leq0.2$);

an upper main body layer surrounded by the lower main body layer, the upper main body layer comprising a $Si_{1-x}Ge_x$ layer (here, $0.3<x\leq0.6$); and a capping layer covering a top surface of the upper main body layer, the capping layer comprising at least one of an undoped silicon (Si) layer, a Si layer doped with a p-type dopant, or a silicon germanium (SiGe) layer having a lower germanium (Ge) content than the upper main body layer.

12. The integrated circuit device of claim 8, further comprising:

a device isolation film covering both sidewalls of a lower portion of each of the first fin-type active region, the second fin-type active region, and the third fin-type active region;

first recess-side insulating spacers covering both sidewalls of a lower portion of the third fin-type active region between the device isolation film and the first source/drain region, the first recess-side insulating spacers being in contact with a lower portion of the first source/drain region; and second recess-side insulating spacers covering the both sidewalls of the lower portion of the third fin-type active region between the device isolation film and the second source/drain region, the second recess-side insulating spacers being apart from the third source/drain region, wherein a first height of each of the first recess-side insulating spacers is greater than a second height of each of the second recess-side insulating spacers in a vertical direction perpendicular to both the first lateral direction and the second lateral direction.

13. The integrated circuit device of claim 8, further comprising:

a broad fin-type active region on the substrate, the broad fin-type active region being apart from each of the first fin-type active region, the second fin-type active region, and the third fin-type active region, the broad fin-type active region having a greater width than each of the first fin-type active region, the second fin-type active region, and the third fin-type active region;

a broad nanosheet stack comprising at least one broad nanosheet that is apart from a fin top surface of the broad fin-type active region in a vertical direction perpendicular to both the first lateral direction and the second lateral direction; and a third source/drain region in contact with one sidewall of the broad nanosheet stack, wherein each of the first source/drain region, the second source/drain region, and the third source/drain region comprises a lower main body layer and an upper main body layer, the lower main body layer comprising a first SiGe layer having a first Ge content, the upper main body layer comprising a second SiGe layer having a Ge content that is higher than the first Ge content, the lower main body layer of the third source/drain region adjacent to the broad nanosheet stack includes a core portion and a surrounding portion, the surrounding portion including a side sub-portion and a bottom sub-portion in contact with the broad fin-type active region, the lower main body layer of at least one of the first source/drain region and the second source/drain region that is adjacent to the first nanosheet stack includes a core portion and a surrounding portion, the surrounding portion including a side sub-portion and a bottom sub-portion in contact with the first fin-type active region, a thickness of the side sub-portion of the lower main body layer of the third source/drain region is greater than a thickness of the side sub-portion of the lower main body layer of at least one of the first source/drain region and the second source/drain region, and a thickness of the bottom sub-portion of the lower main body layer of the third source/drain region is less than a thickness of the bottom sub-portion of the lower main body layer of at least one of the first source/drain region and the second source/drain region.

14. An integrated circuit device comprising:

a plurality of fin-type active regions extending in a first lateral direction on a substrate;

a plurality of source/drain regions on the plurality of fin-type active regions;

at least one nanosheet on a fin top surface of a first fin-type active region, the first fin-type active region being selected from the plurality of fin-type active regions;
a gate structure surrounding the at least one nanosheet on the first fin-type active region, the gate structure extending in a second lateral direction, the second lateral direction being perpendicular to the first lateral direction;
a first source/drain region selected from the plurality of source/drain regions, the first source/drain region being on the first fin-type active region and having a first side surface in contact with one sidewall of the at least one nanosheet;
a second source/drain region selected from the plurality of source/drain regions, the second source/drain region being on the first fin-type active region and having a second side surface in contact with another sidewall of the at least one nanosheet;
a third source/drain region selected from the plurality of source/drain regions, the third source/drain region being closest to the first source/drain region in the second lateral direction, the third source/drain region being a first distance apart from the first fin-type active region; and
a fourth source/drain region selected from the plurality of source/drain regions, the fourth source/drain region being closest to the second source/drain region in the second lateral direction, the fourth source/drain region being a second distance apart from the first fin-type active region, the second distance being greater than the first distance,
wherein a greatest width of the first source/drain region is less than a greatest width of the second source/drain region in the second lateral direction, and
a first vertical level of a first lowermost surface of the first source/drain region, which is in contact with the first fin-type active region, is lower than a second vertical level of a second lowermost surface of the second source/drain region, which is in contact with the first fin-type active region.

15. The integrated circuit device of claim 14, wherein each of the first source/drain region, the second source/drain region, and the third source/drain region comprises a lower main body layer and an upper main body layer, the lower main body layer comprising a first silicon germanium (SiGe) layer having a first Ge content, the upper main body layer comprising a second SiGe layer having a Ge content that is higher than the first Ge content, and
the fourth source/drain region comprises a Si layer doped with an n-type dopant or a silicon carbide (SiC) layer doped with the n-type dopant.

16. The integrated circuit device of claim 14, wherein each of the first source/drain region, the second source/drain region, and the third source/drain region constitutes a P-channel metal-oxide semiconductor (PMOS) transistor, and
the fourth source/drain region constitutes an N-channel metal-oxide semiconductor (NMOS) transistor.

17. The integrated circuit device of claim 14, further comprising:
a device isolation film covering both sidewalls of a lower portion of the first fin-type active region;
first recess-side insulating spacers covering the both sidewalls of the lower portion of the first fin-type active region between the device isolation film and the first source/drain region, the first recess-side insulating spacers being in contact with a lower portion of the first source/drain region; and
second recess-side insulating spacers covering the both sidewalls of the lower portion of the first fin-type active region between the device isolation film and the second source/drain region, the second recess-side insulating spacers being apart from the second source/drain region,
wherein a first height of each of the first recess-side insulating spacers is greater than a second height of each of the second recess-side insulating spacers in the vertical direction.

18. The integrated circuit device of claim 14, further comprising:
a device isolation film covering both sidewalls of a lower portion of the first fin-type active region;
first recess-side insulating spacers covering the both sidewalls of the lower portion of the first fin-type active region between the device isolation film and the first source/drain region, the first recess-side insulating spacers being in contact with a lower portion of the first source/drain region; and
second recess-side insulating spacers covering the both sidewalls of the lower portion of the first fin-type active region between the device isolation film and the second source/drain region, the second recess-side insulating spacers being apart from the second source/drain region,
wherein an uppermost portion of each of the first recess-side insulating spacers is at a higher vertical level than the first lowermost surface of the first source/drain region, and
an uppermost portion of each of the second recess-side insulating spacers is at a lower vertical level than the second lowermost surface of the second source/drain region.

19. The integrated circuit device of claim 14, further comprising:
a device isolation film covering both sidewalls of a lower portion of the first fin-type active region;
first recess-side insulating spacers covering the both sidewalls of the lower portion of the first fin-type active region between the device isolation film and the first source/drain region, the first recess-side insulating spacers being in contact with a lower portion of the first source/drain region; and
second recess-side insulating spacers covering the both sidewalls of the lower portion of the first fin-type active region between the device isolation film and the second source/drain region, the second recess-side insulating spacers being apart from the second source/drain region,
wherein an uppermost portion of each of the first recess-side insulating spacers is at a higher vertical level than the fin top surface of the first fin-type active region, and
an uppermost portion of each of the second recess-side insulating spacers is at a lower vertical level than the fin top surface of the first fin-type active region.

20. The integrated circuit device of claim 14, wherein the substrate comprises a first region in which the first fin-type active region is located and a second region apart from the first region,
the integrated circuit device further comprises,
a broad fin-type active region in the second region, the broad fin-type active region having a greater width than the first fin-type active region, at least one broad nanosheet on a fin top surface of the broad fin-type active region, and an additional source/drain region on the broad fin-type active region, the additional source/drain region having a side surface in contact with the at least one broad nanosheet, wherein, in the second lateral direction, the at least one nanosheet has a width of about 5 nm to about 25 nm, and the at least one broad nanosheet has a width of about 26 nm to about 45 nm, each of the first source/drain region, the second source/drain region, and the additional source/drain region comprises a lower main body layer and an upper main body layer, the lower main body layer comprising a first SiGe layer having a first Ge content, the upper main body layer comprising a second SiGe layer having a Ge content that is higher than the first Ge content, the lower main body layer of the additional source/drain region includes a core sub-portion and a surrounding portion, the surrounding portion including a side sub-portion and a bottom sub-portion in contact with the broad fin-type active region, the lower main body layer of each of the first source/drain region and the second source/drain region includes a core portion and a surrounding portion, the surrounding portion including a side sub-portion and a bottom sub-portion in contact with the first fin-type active region, a thickness of the side sub-portion of the lower main body layer of the additional source/drain region is greater than a thickness of the side sub-portion of the lower main body layer of each of the first source/drain region and the second source/drain region, and a thickness of the bottom sub-portion of the lower main body layer of the additional source/drain region is less than a thickness of the bottom sub-portion of the lower main body layer of each of the first source/drain region and the second source/drain region.

* * * * *